US012328869B2

(12) United States Patent
Chang et al.

(10) Patent No.: US 12,328,869 B2
(45) Date of Patent: Jun. 10, 2025

(54) SEMICONDUCTOR MEMORY DEVICES AND METHODS FOR FABRICATING THE SAME

(71) Applicant: SAMSUNG ELECTRONICS CO., LTD., Suwon-si (KR)

(72) Inventors: Ji Hoon Chang, Yongin-si (KR); Jung-Hoon Han, Hwaseong-si (KR); Ji Seok Hong, Suwon-si (KR); Dong-Sik Park, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 77 days.

(21) Appl. No.: 17/371,873

(22) Filed: Jul. 9, 2021

(65) Prior Publication Data

US 2022/0139927 A1    May 5, 2022

(30) Foreign Application Priority Data

Nov. 3, 2020  (KR) .......................... 10-2020-0145195

(51) Int. Cl.
*H10B 12/00*  (2023.01)
*H10D 64/01*  (2025.01)

(52) U.S. Cl.
CPC ............ *H10B 12/50* (2023.02); *H10B 12/09* (2023.02); *H10B 12/315* (2023.02); *H10B 12/482* (2023.02); *H10B 12/485* (2023.02); *H10D 64/021* (2025.01)

(58) Field of Classification Search
CPC .... H10B 12/09; H10B 12/315; H10B 12/482; H10B 12/485; H10B 12/50; H10B 10/18; H10B 51/40; H10B 51/50; H10B 53/40; H10B 53/50; H01L 29/6656
See application file for complete search history.

(56) References Cited

U.S. PATENT DOCUMENTS

| 7,172,939 | B1 | 2/2007 | Chou et al. |
| 8,765,491 | B2 | 7/2014 | Cai et al. |
| 9,209,193 | B2 | 12/2015 | Ueda |
| 9,263,275 | B2 | 2/2016 | Liang et al. |
| 10,535,664 | B2 | 1/2020 | Chen et al. |

(Continued)

*Primary Examiner* — Donald H B Braswell
*Assistant Examiner* — John Lin
(74) *Attorney, Agent, or Firm* — Myers Bigel, P.A.

(57) ABSTRACT

The present disclosure provides a semiconductor memory device capable of improving reliability and performance. The semiconductor memory device comprises a substrate including a cell region and a peripheral region around the cell region, a cell region isolation film which defines the cell region, a bit line structure in the cell region, a first peripheral gate structure on the peripheral region of the substrate, the first peripheral gate structure comprising a first peripheral gate conduction film and a first peripheral capping film on the first peripheral gate conduction film, a peripheral interlayer insulating film around the first peripheral gate structure and an insertion interlayer insulating film on the peripheral interlayer insulating film and the first peripheral gate structure, and including a material different from the peripheral interlayer insulating film. An upper face of the peripheral interlayer insulating film is lower than an upper face of the first peripheral capping film.

15 Claims, 40 Drawing Sheets

(56) References Cited

U.S. PATENT DOCUMENTS

| | | | |
|---|---|---|---|
| 2006/0186479 A1* | 8/2006 | Seo | H10B 12/09 257/E21.507 |
| 2011/0159677 A1* | 6/2011 | Lee | H10B 12/09 438/586 |
| 2014/0021551 A1 | 1/2014 | Nam et al. | |
| 2014/0042508 A1 | 2/2014 | Lee | |
| 2014/0131786 A1* | 5/2014 | Ryu | H10B 12/09 257/316 |
| 2014/0332905 A1 | 11/2014 | Lee et al. | |
| 2019/0326278 A1* | 10/2019 | Lee | H01L 29/66545 |
| 2019/0355843 A1 | 11/2019 | Then et al. | |

* cited by examiner

SEMICONDUCTOR MEMORY DEVICES AND METHODS FOR FABRICATING THE SAME

CROSS-REFERENCE TO RELATED APPLICATION

This application claims priority from Korean Patent Application No. 10-2020-0145195, filed on Nov. 3, 2020, in the Korean Intellectual Property Office, and all the benefits accruing therefrom under 35 U.S.C. § 119, the contents of which in its entirety are herein incorporated by reference.

BACKGROUND

1. Field of the Disclosure

The present disclosure relates to semiconductor memory devices and methods for fabricating the same.

2. Description of the Related Art

As semiconductor elements are increasingly highly integrated, individual circuit patterns become finer in order to implement more semiconductor elements in the same area. That is, as the degree of integration of the semiconductor element increases, dimensions of design rules of the components of the semiconductor element may decrease.

In highly scaled semiconductor elements, a process of forming a plurality of wiring lines and a plurality of buried contacts (BC) interposed between the wiring lines may become gradually more complicated and difficult to implement.

SUMMARY

Aspects of the present disclosure provide semiconductor memory devices having an improved reliability and performance.

Aspects of the present disclosure also provide methods for fabricating semiconductor memory devices having an improved reliability and performance.

However, aspects of the present disclosure are not restricted to those forth herein. Those and other aspects of the present disclosure will become more apparent to one of ordinary skill in the art to which the present disclosure pertains by referencing the detailed description of the present disclosure given below.

According to an aspect of the present disclosure, there is provided a semiconductor memory device comprising: a substrate comprising a cell region and a peripheral region around the cell region; a cell region isolation film in the substrate, the cell region isolation film defining the cell region; a bit line structure on the cell region; a first peripheral gate structure on the peripheral region of the substrate, the first peripheral gate structure comprising a first peripheral gate conduction film and a first peripheral capping film on the first peripheral gate conduction film; a peripheral interlayer insulating film around the first peripheral gate structure and on the substrate; and an insertion interlayer insulating film on the peripheral interlayer insulating film and the first peripheral gate structure, the insertion interlayer insulating film comprising a material that is different from the peripheral interlayer insulating film, wherein an upper face of the peripheral interlayer insulating film is closer to the substrate than an upper face of the first peripheral capping film.

According to another aspect of the present disclosure, there is provided a semiconductor memory device comprising: a substrate comprising a cell region and a peripheral region around the cell region; a bit line structure on the cell region; a first peripheral gate structure, a second peripheral gate structure, and a third peripheral gate structure on the peripheral region of the substrate and spaced apart from each other; and a peripheral interlayer insulating film placed around the first to third peripheral gate structures on the substrate, wherein each of the first to third peripheral gate structures comprises a peripheral gate conduction film, a peripheral capping film on the peripheral gate conduction film, and a peripheral spacer on side walls of the peripheral gate conduction film and the peripheral capping film, wherein the first peripheral gate structure is between the second peripheral gate structure and the third peripheral gate structure, wherein an upper face of the peripheral interlayer insulating film is closer to the substrate than an upper face of the peripheral capping film of each of the first to third peripheral gate structures, wherein a first distance between the peripheral gate conduction film of the first peripheral gate structure and the peripheral gate conduction film of the second peripheral gate structure is different from a second distance between the peripheral gate conduction film of the first peripheral gate structure and the peripheral gate conduction film of the third peripheral gate structure, and wherein a height, with respect to an upper face of the substrate, of the upper face of the peripheral interlayer insulating film between the first peripheral gate structure and the second peripheral gate structure is different from a height, with respect to the upper face of the substrate, of the upper face of the peripheral interlayer insulating film between the first peripheral gate structure and the third peripheral gate structure.

According to another aspect of the present disclosure, there is provided a semiconductor memory device comprising: a substrate comprising a cell region and a peripheral region around the cell region; a cell region isolation film defining the cell region in the substrate; a bit line structure on the cell region of the substrate, the bit line structure comprising a cell conduction line extending in a first direction and a cell line capping film on the cell conduction line; a cell gate electrode in the cell region of the substrate and intersecting the cell conduction line; a block conductive structure comprising a block conduction line separated from the cell conduction line in the first direction and a block capping film on the block conduction line; a peripheral gate structure on the peripheral region of the substrate, the peripheral gate structure comprising a peripheral gate conduction film and a peripheral capping film on the peripheral gate conduction film, wherein an upper face of the peripheral capping film is closer to the substrate than an upper face of the cell line capping film; a peripheral interlayer insulating film around the peripheral gate structure and on the substrate; and a cell interlayer insulating film on the cell region isolation film between the block conduction line and the cell conduction line, the cell interlayer insulating film comprising a same material as the peripheral interlayer insulating film, wherein a height, with respect to an upper face of the substrate, of an upper face of the peripheral interlayer insulating film is smaller than a height, with respect to the upper face of the substrate, of the upper face of the peripheral capping film.

According to another aspect of the present disclosure, there is provided a method for fabricating a semiconductor memory device, the method comprising: providing a substrate comprising a cell region and a peripheral region defined around the cell region; forming a cell gate electrode within the cell region of the substrate; forming a cell conduction film structure on the cell region of the substrate, the cell conduction film structure comprising a pre-cell conduction film and a lower cell capping film on the pre-cell conduction film; forming a peripheral gate structure on the peripheral region of the substrate, wherein the peripheral gate structure comprises a peripheral gate conduction film and a peripheral capping film on the peripheral gate conduction film, and wherein the peripheral gate structure is formed simultaneously with the cell conduction film structure; forming an etching stop film on the substrate, the etching stop film extending along a profile of the cell conduction film structure and a profile of the peripheral gate structure; forming a first pre-interlayer insulating film on the etching stop film; removing the first pre-interlayer insulating film on an upper face of the cell conduction film structure and an upper face of the peripheral gate structure to form a second pre-interlayer insulating film on the etching stop film; removing a part of the second pre-interlayer insulating film through an etch-back process to form a peripheral interlayer insulating film around the peripheral gate structure; forming an insertion interlayer insulating film on the etching stop film of the cell region and the peripheral region, after forming the peripheral interlayer insulating film; and patterning the cell conduction film structure and the insertion interlayer insulating film on the cell region to form a bit line structure on the substrate, wherein a height, with respect to an upper face of the substrate, of an upper face of the peripheral interlayer insulating film is smaller than a height, with respect to the upper face of the substrate, of an upper face of the peripheral capping film.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

Figure 1:
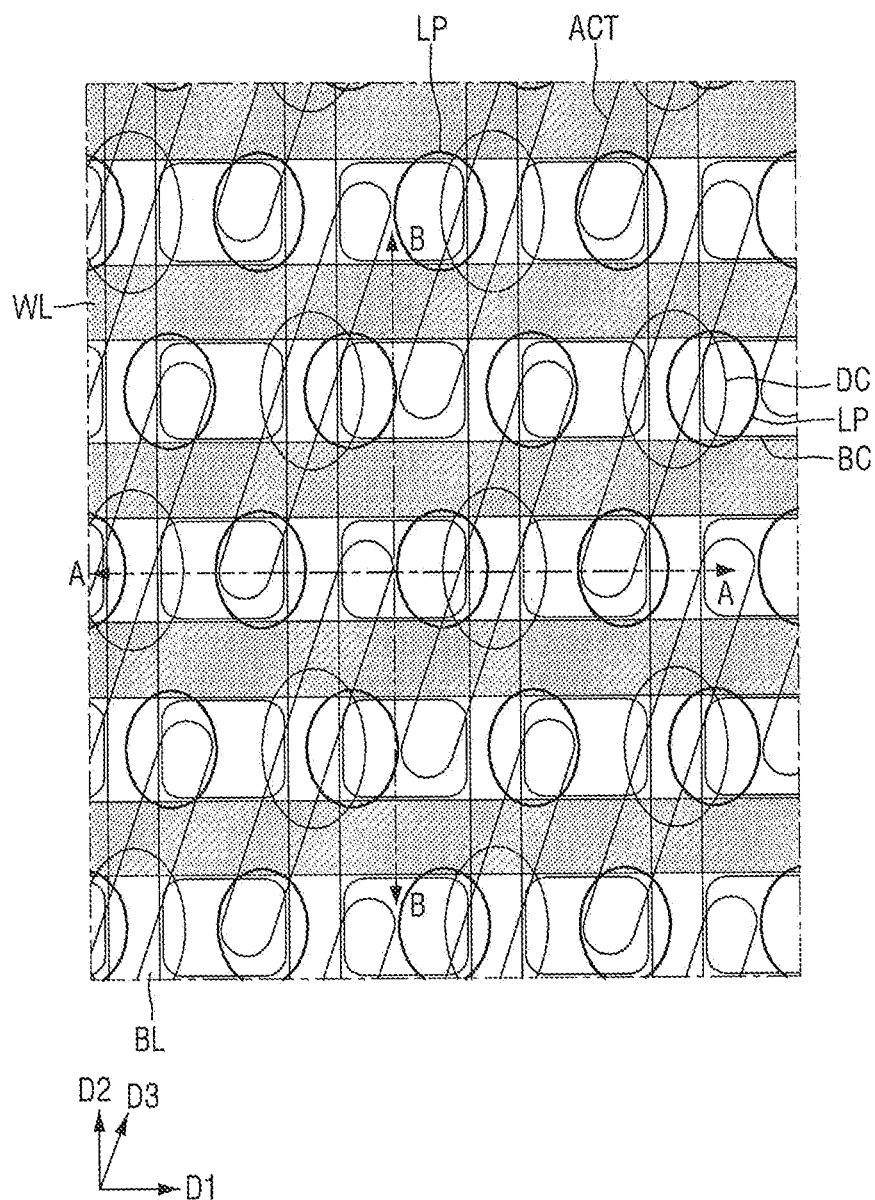
FIG. 1 is a schematic layout showing a cell region of a semiconductor memory device according to some embodiments of the present disclosure.
Figure 2:
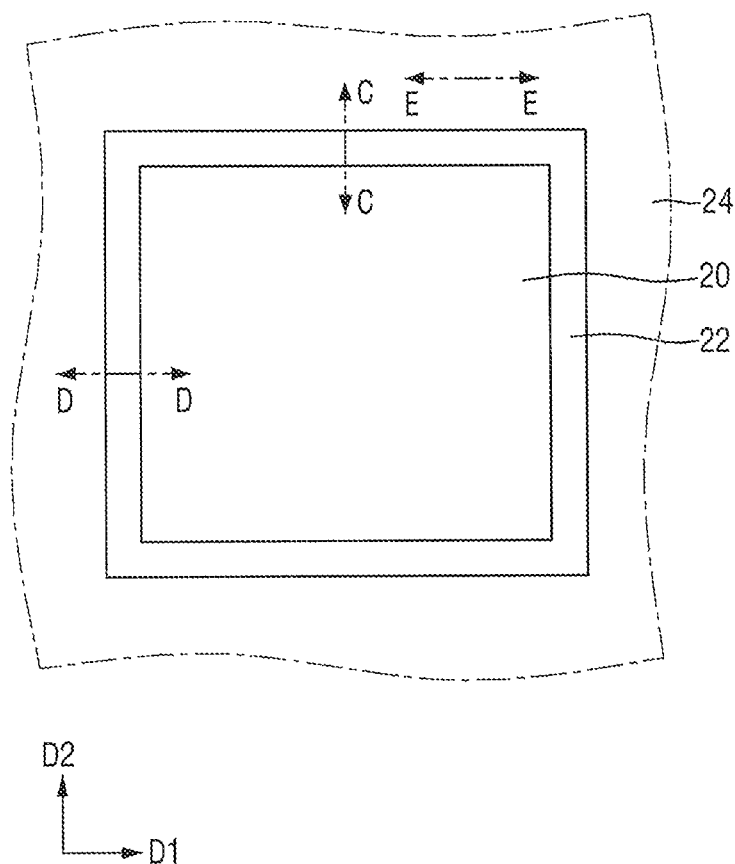
FIG. 2 is a schematic layout of the semiconductor memory device including the cell region of FIG. 1.
Figure 3:
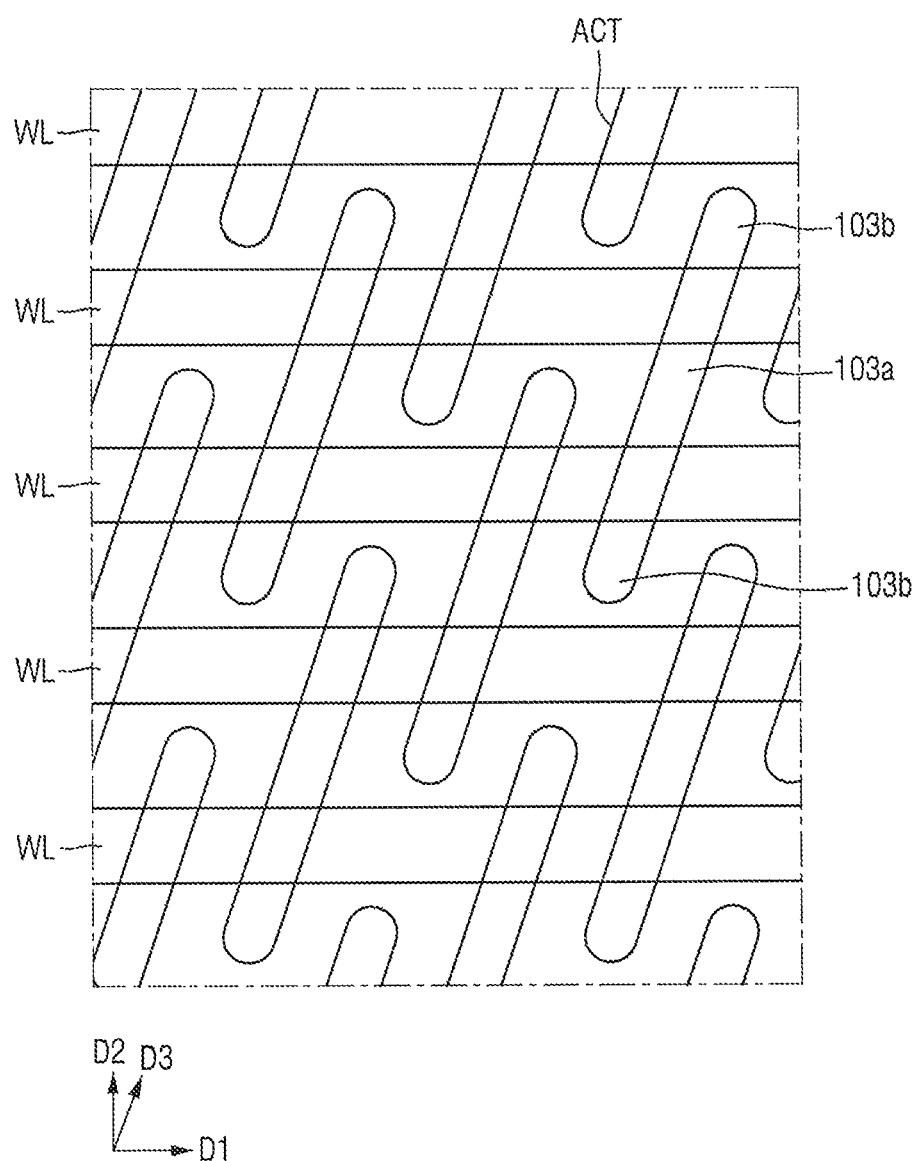
FIG. 3 is a layout showing word lines and active regions of FIG. 1.
Figure 4:
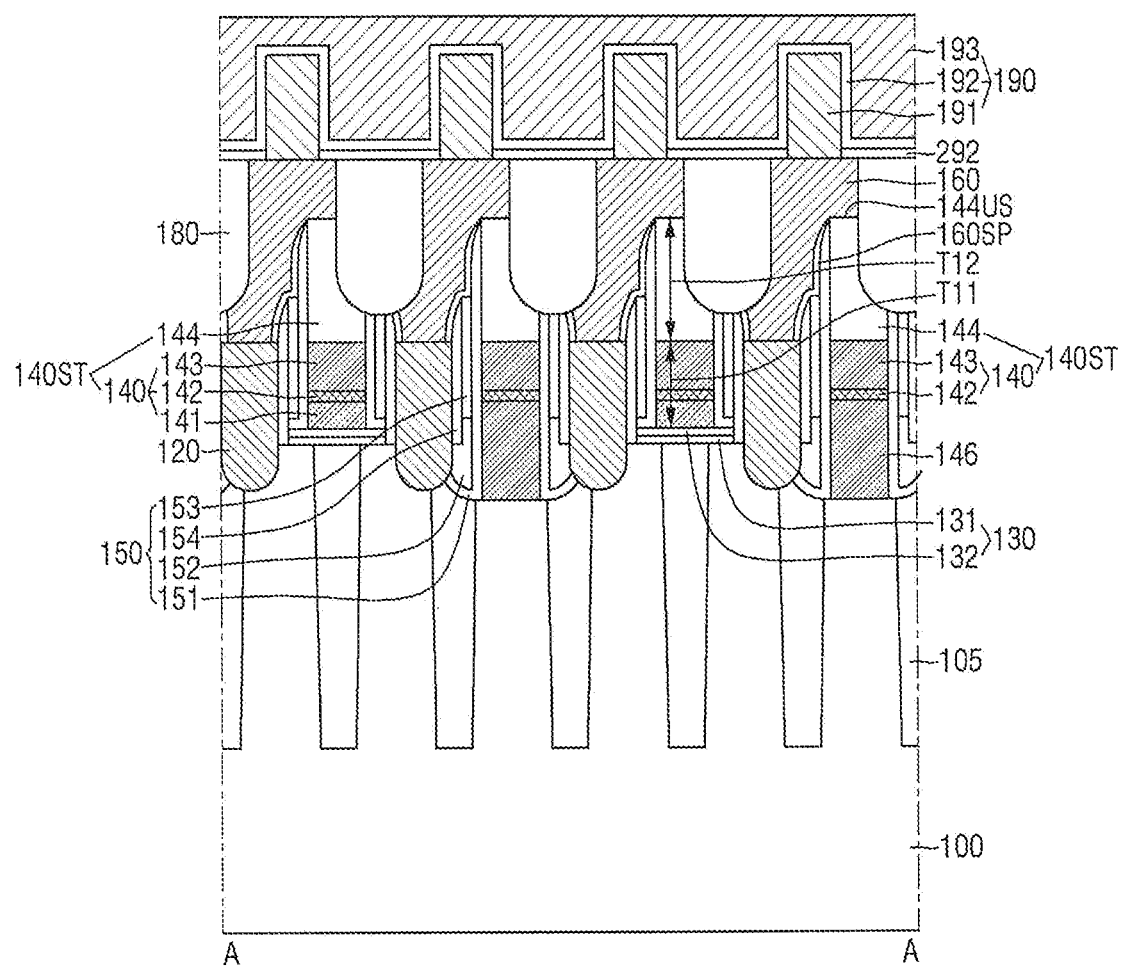
FIGS. 4 and 5 are cross-sectional views taken along lines A-A and B-B of FIG. 1, respectively.
Figure 5:
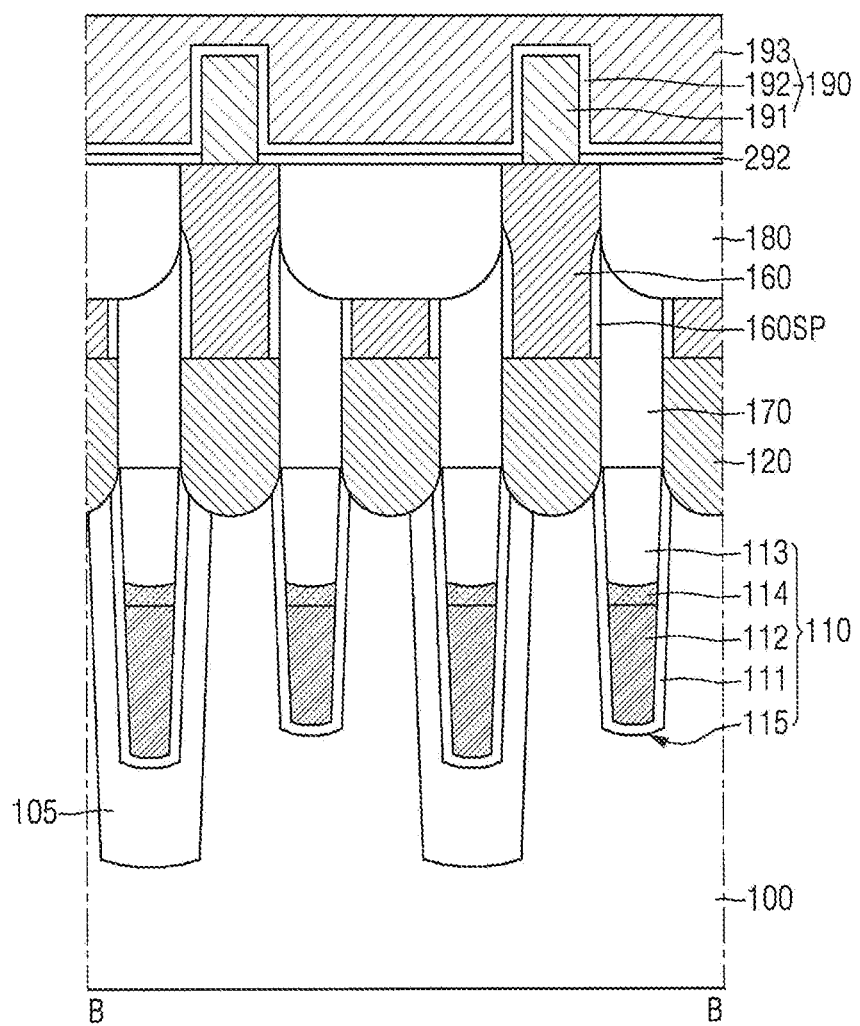
Figure 6:
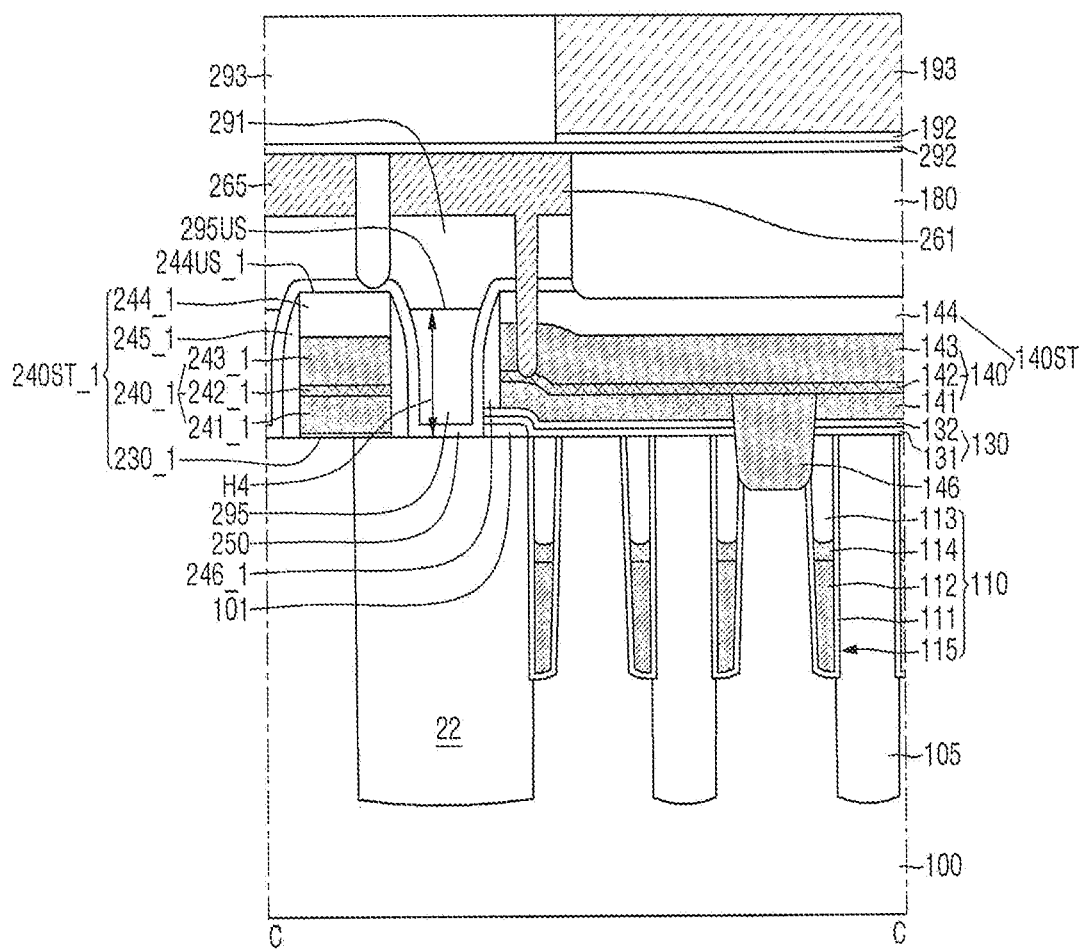
FIGS. 6 and 7 are cross-sectional views taken along lines C-C and D-D of FIG. 2, respectively.
Figure 7:
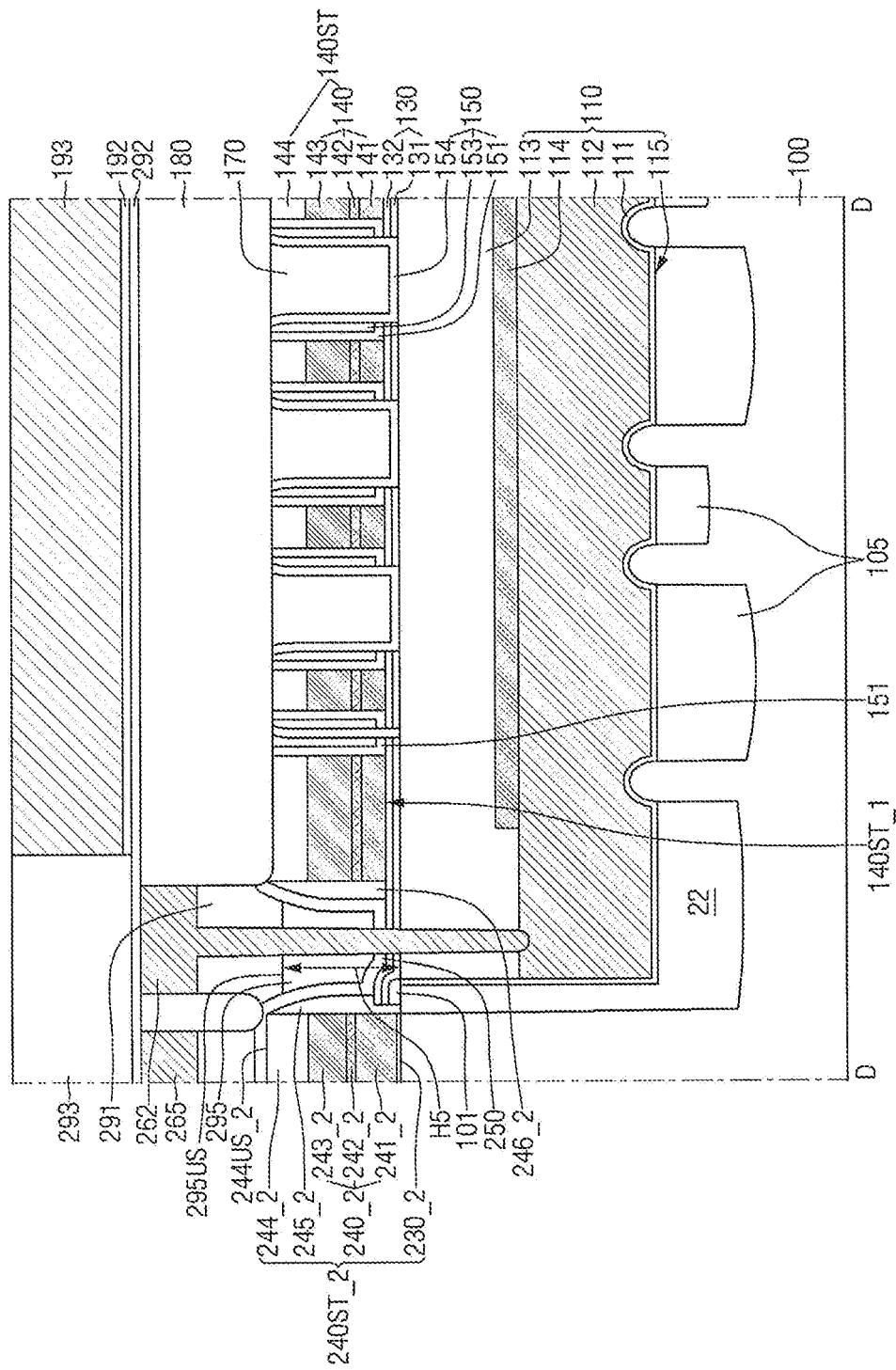
Figure 8:
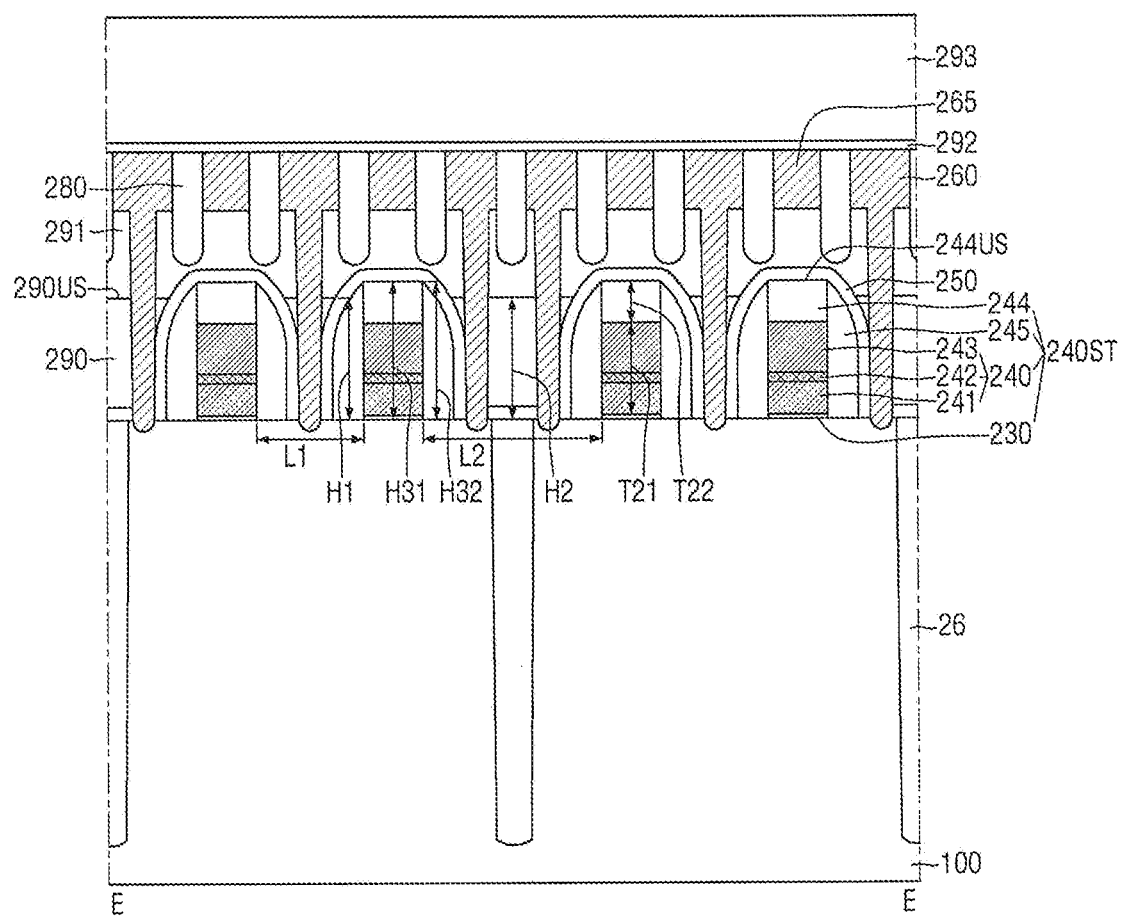
FIG. 8 is a cross-sectional view taken along a line E-E of FIG. 2.

FIG. 1 is a schematic layout showing a cell region of a semiconductor memory device according to some embodiments. FIG. 2 is a schematic layout of the semiconductor memory device including the cell region of FIG. 1. FIG. 3 is a layout showing only word lines and active regions of FIG. 1. FIGS. 4 and 5 are cross-sectional views taken along lines A-A and B-B of FIG. 1, respectively. FIGS. 6 and 7 are cross-sectional views taken along lines C-C and D-D of FIG. 2, respectively. FIG. 8 is a cross-sectional view taken along a line E-E of FIG. 2.

For reference, FIG. 6 may be a cross-sectional view taken along a bit line BL of FIG. 1 in a cell region isolation film 22. FIG. 7 may be a cross-sectional view taken along a word line WL of FIG. 1 in the cell region isolation film 22. FIG. 8 may be a cutaway example cross-sectional view of a transistor forming region of a peri region.

In the drawings of the semiconductor device according to some embodiments, although a DRAM (dynamic random access memory) is shown as an example, the embodiments of the present disclosure are not limited thereto.

Referring to FIGS. 1 to 3, the semiconductor device according to some embodiments may include a cell region 20, a cell region isolation film 22, and a peri (e.g., peripheral) region 24. Herein, the terms peri and peripheral may be used interchangeably.

The cell region isolation film 22 may be formed along the periphery of the cell region 20. The cell region isolation film 22 may separate the cell region 20 and the peri region 24. The peri region 24 may be defined around the cell region 20.

The cell region 20 may include a plurality of cell active regions ACT. The cell active region ACT may be defined by a cell element isolation film (105 of FIG. 4) formed in a substrate (100 of FIG. 4). In some embodiments, (e.g., with the decrease of dimensions in design rules of the semiconductor device), the cell active region ACT may be placed in the form of a bar of a diagonal line (or oblique line), as shown. For example, the cell active region ACT may extend in a third direction D3.

A plurality of gate electrodes may be placed in a first direction D1 across the cell active region ACT. The plurality of gate electrodes may extend parallel to each other. The plurality of gate electrodes may be, for example, a plurality of word lines WL. The word lines WL may be placed at equal intervals. A width of the word line WL or a gap between the word lines WL may be determined according to the design rules.

Each cell active region ACT may be divided into three portions by two word lines WL extending in the first direction D1. The cell active region ACT may include a storage connection region 103$b$ and a bit line connection region 103$a$. The bit line connection region 103$a$ may be located at a central portion (e.g., in the third direction D3)

of the cell active region ACT, and the storage connection region 103b may be located at the end portion of the cell active region ACT.

A plurality of bit lines BL extending in a second direction D2 orthogonal to the word line WL may be placed on the word line WL. The plurality of bit lines BL may extend parallel to each other. The bit lines BL may be placed at equal intervals. The width of the bit line BL or the gap between the bit lines BL may be determined according to the design rules.

The semiconductor device according to some embodiments may include various contact arrangements formed on the cell active region ACT. Various contact arrangements may include, for example, a direct contact DC, a buried contact BC, a landing pad LP or the like.

Here, the direct contact DC may mean a contact that electrically connects the cell active region ACT to the bit line BL. The buried contact BC may mean a contact that connects the cell active region ACT to a lower electrode (191 of FIG. 4) of a capacitor. Due to the arrangement structure, a contact area between the buried contact BC and the cell active region ACT may be small. Accordingly, a conductive landing pad LP may be introduced to increase the contact area with the cell active region ACT and/or increase the contact area with the lower electrode (191 of FIG. 4) of the capacitor. As used herein, the term "and/or" includes any and all combinations of one or more of the associated listed items. Expressions such as "at least one of," when preceding a list of elements, modify the entire list of elements and do not modify the individual elements of the list.

The landing pad LP may be placed between the cell active region ACT and the buried contact BC, and may also be placed between the buried contact BC and the lower electrode (191 of FIG. 4) of the capacitor. In the semiconductor device according to some embodiments, the landing pad LP may be placed between the buried contact BC and the lower electrode of the capacitor. By increasing the contact area through introduction of the landing pad LP, a contact resistance between the cell active region ACT and the capacitor lower electrode may be reduced.

The direct contact DC may be connected to the bit line connection region 103a. The buried contact BC may be connected to the storage connection region 103b. As the buried contacts BC may be placed at both end portions of the cell active region ACT, the landing pads LP may be placed to partially overlap the buried contact BC to be adjacent to both ends of the cell active region ACT. In some embodiments, the buried contact BC may be formed to overlap the cell active region ACT and the cell element isolation film (105 of FIG. 4) between adjacent word lines WL and between adjacent bit lines BL.

The word line WL may be formed as a structure buried in the substrate 100. The word line WL may be placed across the cell active region ACT between the direct contacts DC or between the buried contacts BC. As shown, two word lines WL may be placed across one cell active region ACT. As the cell active region ACT extends along the third direction D3, the word line WL may have an angle of less than 90 degrees with the cell active region ACT.

The direct contact DC and the buried contact BC may be placed symmetrically. Therefore, the direct contact DC and the buried contact BC may be placed on a straight line along the first direction D1 and the second direction D2. On the other hand, unlike the direct contact DC and the buried contact BC, the landing pad LP may be placed in a zigzag form in the second direction D2 (e.g., alternately arranged along a first line and a second line extending in the second direction D2) along which the bit line BL extends. Also, the landing pad LP may be placed to overlap the same side portion of each bit line BL in the first direction D1 along which the word line WL extends. For example, each of the landing pads LP of the first line may overlap a left side of the corresponding bit line BL, and each of the landing pads LP of the second line may overlap a right side of the corresponding bit line BL.

Referring to FIGS. 1 to 8, the semiconductor device according to some embodiments may include a plurality of cell gate structures 110, a plurality of bit line structures 140ST, a plurality of storage contacts 120, an information storage part 190 and a peri gate structure 240ST.

The substrate 100 may include a cell region 20, a cell region isolation film 22, and a peri region 24. The substrate 100 may be a silicon substrate or an SOI (silicon-on-insulator). In some embodiments, the substrate 100 may include, but is not limited to, silicon germanium, SGOI (silicon germanium on insulator), indium antimonide, lead tellurium compounds, indium arsenic, indium phosphide, gallium arsenide or gallium antimonide.

The plurality of cell gate structures 110, the plurality of bit line structures 140ST, the plurality of storage contacts 120, and the information storage part 190 may be placed in the cell region 20. The peri gate structure 240ST may be placed in the peri region 24.

The cell element isolation film 105 may be formed in the substrate 100 of the cell region 20. The cell element isolation film 105 may have an STI (shallow trench isolation) structure having excellent element isolation characteristics. The cell element isolation film 105 may define a cell active region ACT inside the cell region 20. The cell active region ACT defined by the cell element isolation film 105 may have a long island shape including a major axis and a minor axis as shown in FIGS. 1 and 3. The cell active region ACT may have an oblique line form to have an angle of less than 90 degrees to the word line WL formed in the cell element isolation film 105. Further, the cell active region ACT may have an oblique line form to have an angle of less than 90 degrees to the bit line BL formed on the cell element isolation film 105.

The cell region isolation film 22 may also form a cell boundary isolation film having an STI structure. The cell region 20 may be defined by the cell region isolation film 22.

The cell element isolation film 105 and the cell region isolation film 22 may each include, for example, but are not limited to, at least one of a silicon oxide film, a silicon nitride film and/or a silicon oxynitride film. In FIGS. 4 to 8, although the cell element isolation film 105 and the cell region isolation film 22 are each shown as being formed of a single insulating film, this is only for convenience of explanation, and the embodiments of the present disclosure are not limited thereto. The cell element isolation film 105 and the cell region isolation film 22 may each be formed of a single insulating film or may be formed of a plurality of insulating films, depending on the widths of the cell element isolation film 105 and/or the cell region isolation film 22.

Although an upper face of the cell element isolation film 105, an upper face of the substrate 100, and an upper face of the cell region isolation film 22 are shown as being placed on the same plane in FIGS. 6 and 7, this is only for convenience of explanation, and the embodiments of the present disclosure are not limited thereto.

The cell gate structure 110 may be formed in the substrate 100 and the cell element isolation film 105. The cell gate structure 110 may be formed across the cell element isolation film 105 and the cell active region ACT defined by the cell element isolation film 105. The cell gate structure 110 may include a cell gate trench 115, a cell gate insulating film 111, a cell gate electrode 112, a cell gate capping pattern 113, and a cell gate capping conductive film 114 that are formed in the substrate 100 and the cell element isolation film 105. Here, the cell gate electrode 112 may correspond to the word line WL. In some embodiments, unlike the illustrated case, the cell gate structure 110 may not include the cell gate capping conductive film 114.

The cell gate insulating film 111 may extend along side walls and a bottom face of the cell gate trench 115. The cell gate insulating film 111 may extend along a profile of at least a part of the cell gate trench 115. The cell gate insulating film 111 may include, for example, at least one of silicon oxide, silicon nitride, silicon oxynitride, or a high dielectric constant material having a higher dielectric constant than silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The cell gate electrode 112 may be formed on the cell gate insulating film 111. The cell gate electrode 112 may fill a part of the cell gate trench 115. The cell gate capping conductive film 114 may extend along the upper face of the cell gate electrode 112. Although FIG. 7 shows that the cell gate capping conductive film 114 does not cover a part of the upper face of the cell gate electrode 112, the embodiments of the present disclosure are not limited thereto.

The cell gate electrode 112 may include at least one of a metal, a metal alloy, a conductive metal nitride, a conductive metal carbonitride, a conductive metal carbide, a metal silicide, a doped semiconductor material, a conductive metal oxynitride, and/or a conductive metal oxide. The cell gate electrode 112 may include, for example, but is not limited to, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx and combinations thereof. The cell gate capping conductive film 114 may include, but is not limited to, for example, polysilicon and/or polysilicon germanium.

The cell gate capping pattern 113 may be placed on the cell gate electrode 112 and the cell gate capping conductive film 114. The cell gate capping pattern 113 may fill the cell gate trench 115 that is left after the cell gate electrode 112 and the cell gate capping conductive film 114 are formed. Although the cell gate insulating film 111 is shown to extend along the side walls of the cell gate capping pattern 113, the embodiments of the present disclosure are not limited thereto. The cell gate capping pattern 113 may include, for example, at least one of silicon nitride (SiN), silicon oxynitride (SiON), silicon oxide (SiO₂), silicon carbonitride (SiCN), silicon oxycarbonitride (SiOCN) and combinations thereof.

Although it is not shown, an impurity doping region may be formed on at least one side of the cell gate structure 110. The impurity doping region may be a source/drain region of a transistor.

The bit line structure 140ST may include a cell conduction line 140 and a cell line capping film 144. The cell conduction line 140 may be formed on the substrate 100 and the cell element isolation film 105 in which the cell gate structure 110 is formed. The cell conduction line 140 may intersect the cell element isolation film 105, and the cell active region ACT defined by the cell element isolation film 105. The cell conduction line 140 may be formed to intersect the cell gate structure 110. Here, the cell conduction line 140 may correspond to the bit line BL.

The cell conduction line 140 may be a multi-film structure. The cell conduction line 140 may include, for example, a first cell conduction film 141, a second cell conduction film 142, and a third cell conduction film 143. The first to third cell conduction films 141, 142, and 143 may be sequentially stacked on the substrate 100 and the cell element isolation film 105. Although the cell conduction line 140 is shown as a triple film, the embodiments of the present disclosure are not limited thereto.

The first to third cell conduction films 141, 142, and 143 may each include, for example, at least one of an impurity-doped semiconductor material, a conductive silicide compound, a conductive metal nitride metal, and/or a metal alloy. For example, although the first cell conduction film 141 may include a doped semiconductor material, the second cell conduction film 142 may include at least one of a conductive silicide compound and/or a conductive metal nitride, and the third cell conduction film 143 may include at least one of a metal and/or a metal alloy, the embodiments of the present disclosure are not limited thereto.

A bit line contact 146 may be formed between the cell conduction line 140 and the substrate 100. That is, the cell conduction line 140 may be formed on the bit line contact 146. For example, the bit line contact 146 may be formed at the point where the cell conduction line 140 intersects a central portion of the cell active region ACT having a long island shape. The bit line contact 146 may be formed between the bit line connection region 103a and the cell conduction line 140.

The bit line contact 146 may electrically connect the cell conduction line 140 and the substrate 100. Here, the bit line contact 146 may correspond to a direct contact DC. The bit line contact 146 may include, for example, at least one of an impurity-doped semiconductor material, a conductive silicide compound, a conductive metal nitride, and/or a metal.

In FIG. 4, in a region that overlaps the upper face of the bit line contact 146, the cell conduction line 140 may include a second cell conduction film 142 and a third cell conduction film 143. In a region that does not overlap the upper face of the bit line contact 146, the cell conduction line 140 may include first to third cell conduction films 141, 142, and 143.

Figure 20A:
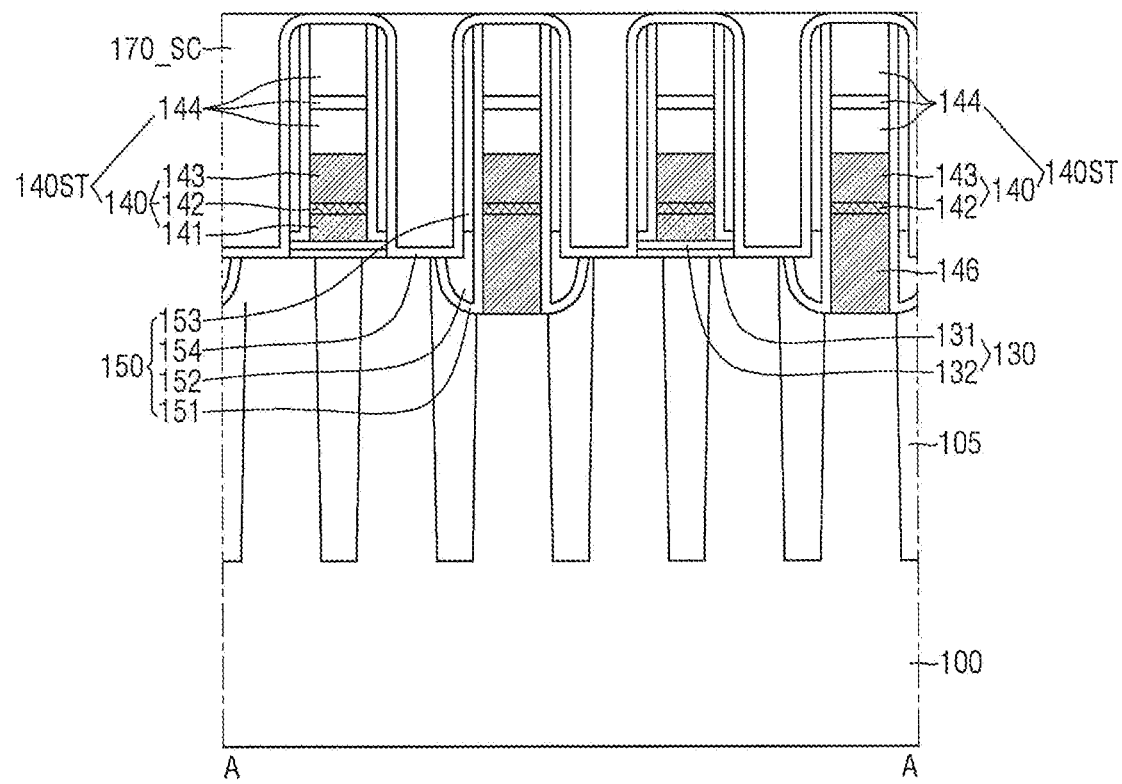
Figure 20B:
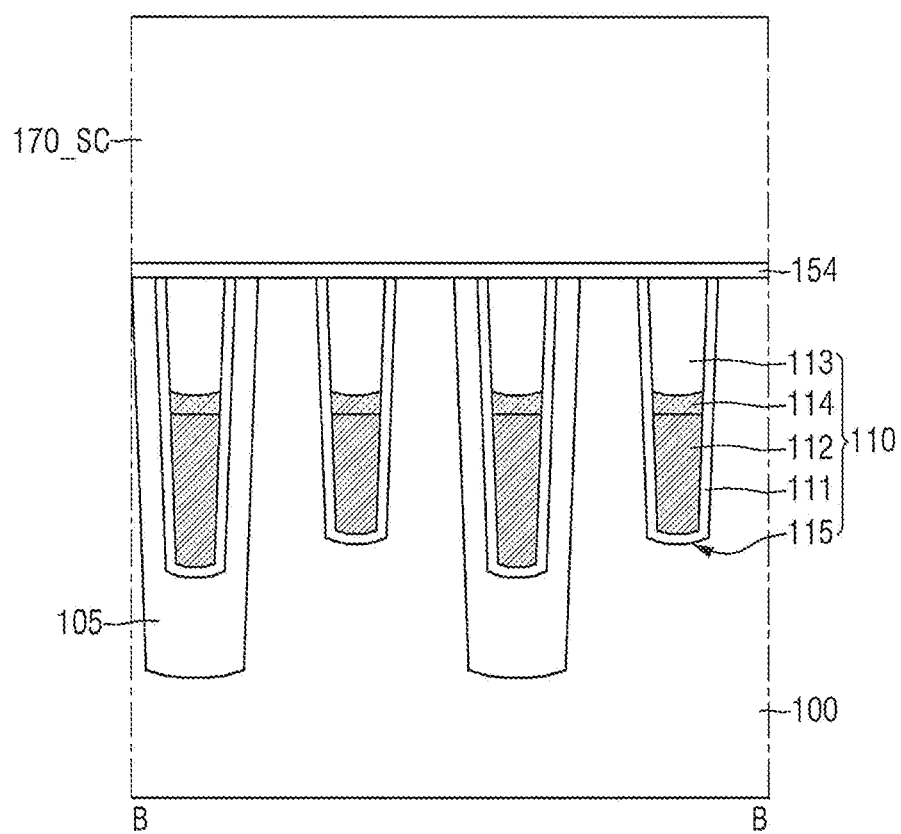
Figure 20C:
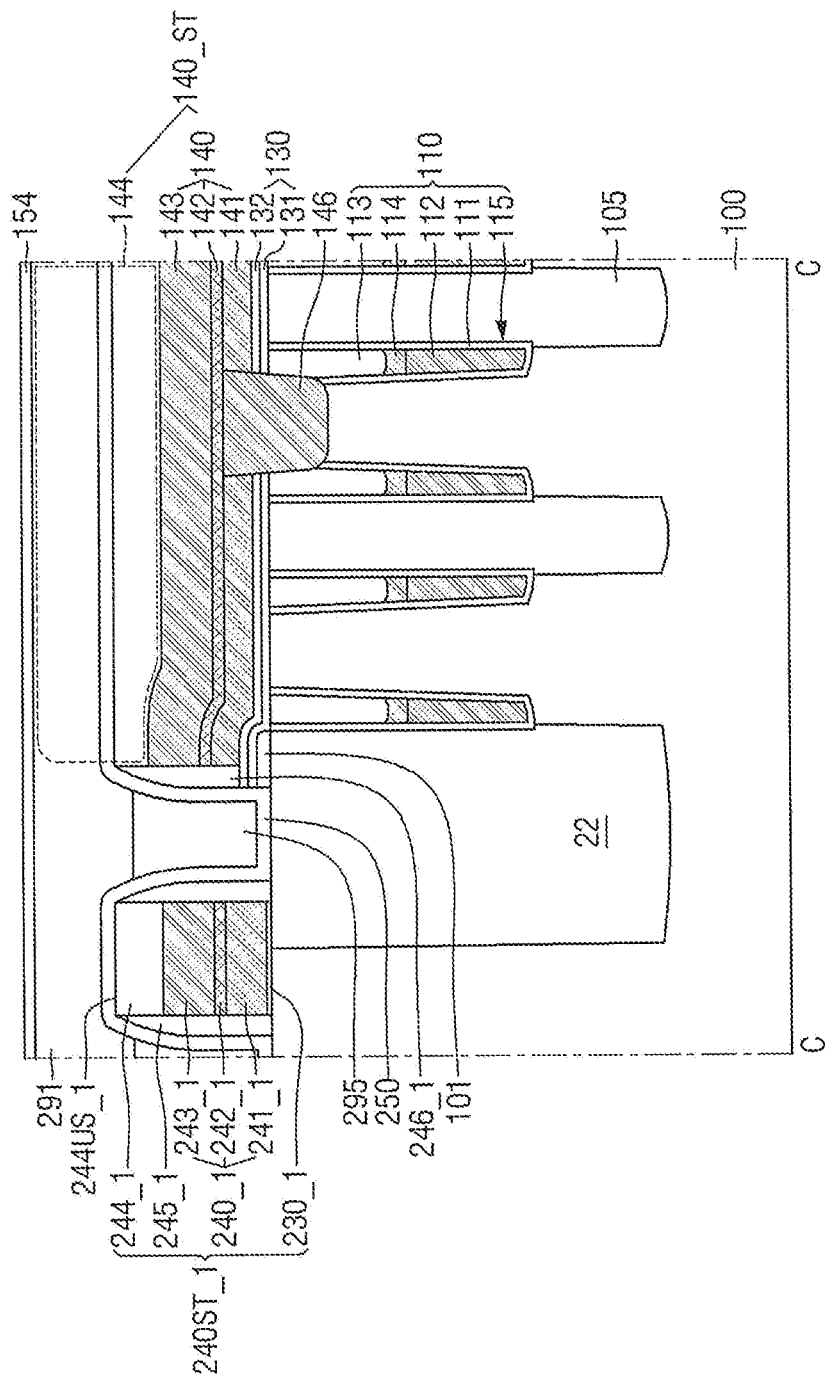
Figure 20D:
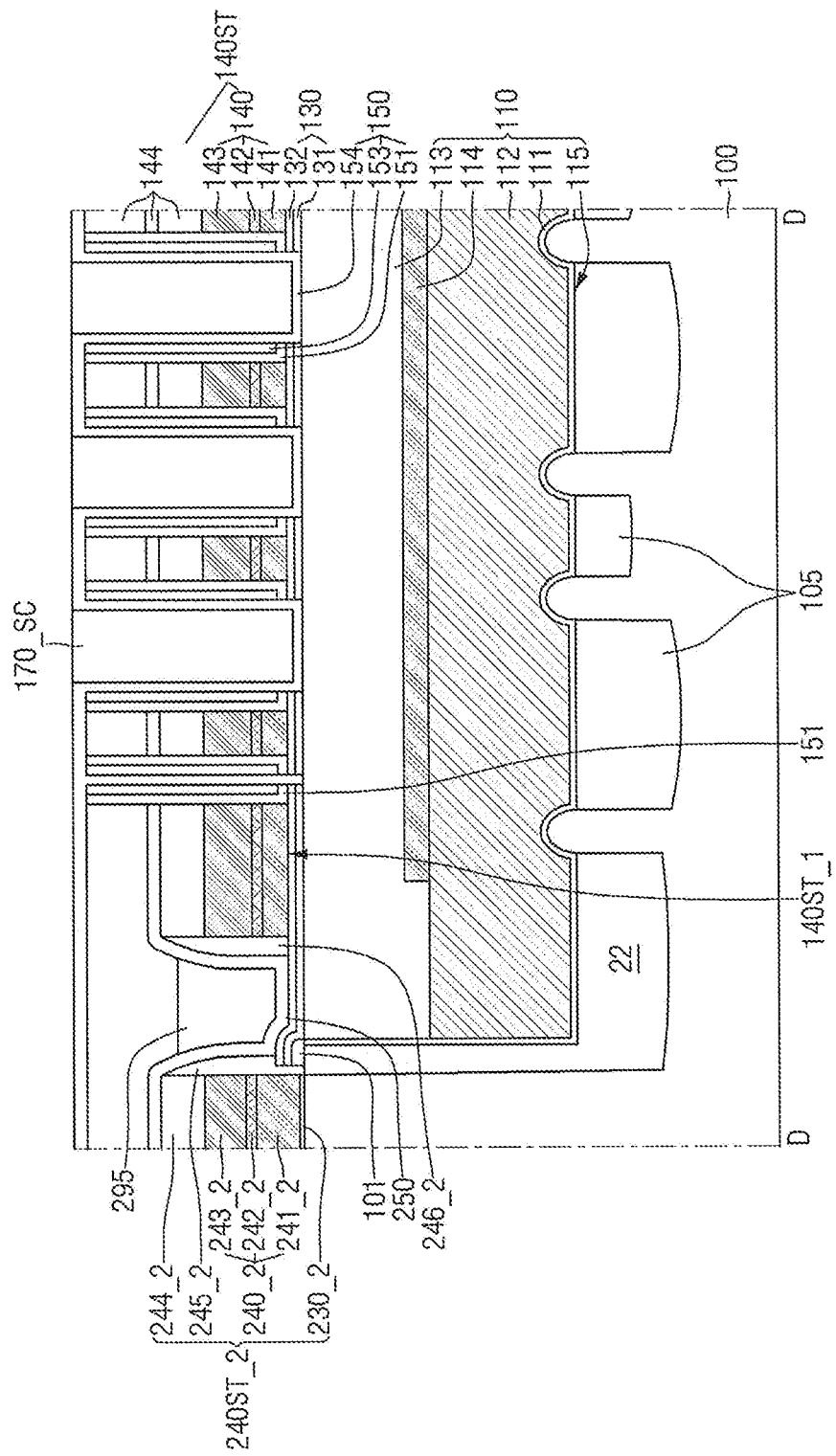
Figure 20E:
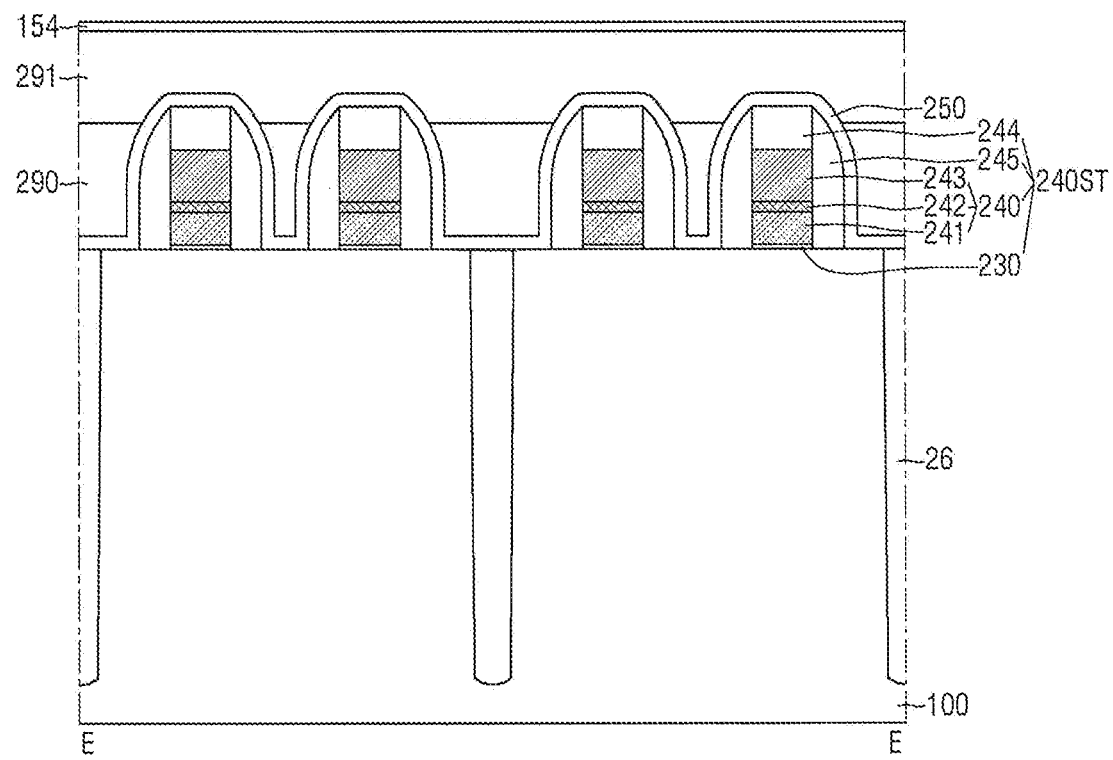

The cell line capping film 144 may be placed on the cell conduction line 140. The cell line capping film 144 may extend in the second direction D2 along the upper face of the cell conduction line 140. At this time, the cell line capping film 144 may include, for example, at least one of silicon nitride film, silicon oxynitride, silicon carbonitride, and/or silicon oxycarbonitride. In the semiconductor memory device according to some embodiments, the cell line capping film 144 may include, for example, a silicon nitride film. Although the cell line capping film 144 is shown as a single film, the embodiments of the present disclosure are not limited thereto. That is, as shown in FIG. 20A, the cell line capping film 144 may be or include a multi-film structure. However, if each film forming the multi-film structure is the same material, the cell line capping film 144 may be seen as a single film.

A cell insulating film 130 may be formed on the substrate 100 and the cell element isolation film 105. More specifically, the cell insulating film 130 may be formed on the substrate 100 and the cell element isolation film 105 in which the bit line contact 146 is not formed. The cell insulating film 130 may be formed between the substrate 100 and the cell conduction line 140, and between the cell element isolation film 105 and the cell conduction line 140.

Although the cell insulating film 130 may be a single film, as shown, the cell insulating film 130 may be or include a multi-film structure including a first cell insulating film 131 and/or a second cell insulating film 132. For example, although the first cell insulating film 131 may include a silicon oxide film, and the second cell insulating film 132 may include a silicon nitride film, the embodiments of the present disclosure are not limited thereto.

A cell buffer film 101 may be placed between the cell insulating film 130 and the cell region isolation film 22. The cell buffer film 101 may include, but is not limited to, for example, a silicon oxide film.

A cell line spacer 150 may be placed on the side walls of the cell conduction line 140 and the cell line capping film 144. The cell line spacer 150 may be formed on the substrate 100 and the cell element isolation film 105 at the portion of the cell conduction line 140 on which the bit line contact 146 is formed. The cell line spacer 150 may be placed on the side walls of the cell conduction line 140, the cell line capping film 144, and the bit line contact 146.

However, in the remaining portions of the cell conduction line 140 in which the bit line contact 146 is not formed, the cell line spacer 150 may be placed on the cell insulating film 130. The cell line spacer 150 may be placed on the side walls of the cell conduction line 140 and the cell line capping film 144.

Although the cell line spacer 150 may be a single film, the cell line spacer 150 may be a multi-film structure including first to fourth cell line spacers 151, 152, 153, and 154. For example, the first to fourth cell line spacers 151, 152, 153, and 154 may include, but are not limited to, one of a silicon oxide film, a silicon nitride film, a silicon oxynitride film (SiON), a silicon oxycarbonitride film (SiOCN), air, and combinations thereof.

For example, the second cell line spacer 152 may not be placed on the cell insulating film 130, but may be placed on the side wall of the bit line contact 146. In FIG. 7, on the upper face of the cell gate structure 110, the fourth cell line spacer 154 may extend along the side wall of the cell conduction line 140 adjacent in the first direction D1 and on the upper face of the cell gate capping pattern 113.

In FIG. 6, a bit line structure 140ST may have a longitudinal axis extending in the second direction D2. The bit line structure 140ST may include a short side wall defined on the cell region isolation film 22. A first cell boundary spacer 246_1 may be placed on a short side wall of the bit line structure 140ST.

That is, the cell line spacer 150 may be placed on a long side wall of the bit line structure 140ST and have a longitudinal axis extending in the second direction D2.

In FIG. 7, a dummy bit line structure 140ST_1 may be placed on the cell region isolation film 22. The dummy bit line structure 140ST_1 may have the same structure as the bit line structure 140ST. That is, the dummy bit line structure 140ST_1 may include a cell conduction line 140 and a cell line capping film 144.

A first cell line spacer 151 and a third cell line spacer 153 may be formed on the first side wall of the dummy bit line structure 140ST_1 facing the bit line structure 140ST. A second cell boundary spacer 246_2 may be placed on a second side wall that is opposite to the first side wall of the dummy bit line structure 140ST_1 in the first direction D1. The second cell boundary spacer 246_2 and the first cell boundary spacer 246_1 may be formed at the same level as a peri spacer 245, a first block spacer 245_1 and a second block spacer 245_2 to be described below. Here, the term "same level" means that they are formed by the same fabricating process.

A fence pattern 170 may be placed on the substrate 100 and the cell element isolation film 105. The fence pattern 170 may be formed to overlap the substrate 100 and the cell gate structure 110 formed in the cell element isolation film 105. The fence pattern 170 may be placed between the bit line structures 140ST extending in the second direction D2. The fence pattern 170 may include, for example, at least one of silicon oxide, silicon nitride, silicon oxynitride, and a combination thereof.

The storage contact 120 may be placed between the cell conduction lines 140 adjacent in the first direction D1. The storage contact 120 may be placed between the fence patterns 170 adjacent in the second direction D2. The storage contact 120 may overlap the substrate 100 and the cell element isolation film 105 between the adjacent cell conduction lines 140. The storage contact 120 may be connected to the storage connection region 103b of the cell active region ACT. Here, the storage contact 120 may correspond to the buried contact BC.

The storage contact 120 may include, for example, at least one of an impurity-doped semiconductor material, a conductive silicide compound, a conductive metal nitride, and/or a metal.

A storage pad 160 may be formed on the storage contact 120. The storage pad 160 may be electrically connected to the storage contact 120. Here, the storage pad 160 may correspond to the landing pad LP.

The storage pad 160 may overlap a part of the upper face of the bit line structure 140ST. The storage pad 160 may include, for example, at least one of an impurity-doped semiconductor material, a conductive suicide compound, a conductive metal nitride, a conductive metal carbide, a metal, and/or a metal alloy.

A storage pad spacer 160SP may be placed on the storage contact 120. The storage pad spacer 160SP may be placed between the storage pad 160 and the bit line structure 140ST, and between the storage pad 160 and the fence pattern 170. Unlike the shown case, the storage pad spacer 160SP may be omitted. The storage pad spacer 160SP may include, for example, at least one of a silicon oxide film, a silicon nitride film, a silicon oxynitride film, a silicon oxycarbonitride film, and/or a silicon carbonitride film (SiCN).

A pad isolation insulating film 180 may be formed on the storage pad 160 and the bit line structure 140ST. For example, the pad isolation insulating film 180 may be placed on the cell line capping film 144. The pad isolation insulating film 180 may define a region of the storage pad 160 that forms a plurality of isolated regions. In some embodiments, the pad isolation insulating film 180 may not cover the upper face of the storage pad 160.

The pad isolation insulating film 180 may include an insulating material to electrically separate a plurality of storage pads 160 from each other. For example, the pad isolation insulating film 180 may include, for example, at least one of a silicon oxide film, a silicon nitride film, a silicon oxynitride film, a silicon oxycarbonitride film, and/or a silicon carbonitride film.

A first etching stop film 292 may be placed on the pad isolation insulating film 180 and the storage pad 160. The first etching stop film 292 may extend to the peri region 24 as well as the cell region 20. The first etching stop film 292 may include at least one of a silicon nitride film, a silicon carbonitride film, a silicon boron nitride film (SiBN), a silicon oxynitride film, and/or a silicon oxycarbide film.

The information storage part 190 may be placed on the storage pad 160. The information storage part 190 may be electrically connected to the storage pad 160. A part of the information storage part 190 may be placed in the etching stop film 292. The information storage part 190 may include, but is not limited to, for example, a capacitor. The information storage part 190 may include a first lower electrode 191, a first capacitor dielectric film 192, and a first upper electrode 193.

The first lower electrode 191 may be placed on the storage pad 160. Although the first lower electrode 191 is shown to have a pillar shape, the embodiments of the present disclosure are not limited thereto. The first lower electrode 191 may, of course, have a cylinder shape. The first capacitor dielectric film 192 is formed on the first lower electrode 191. The first capacitor dielectric film 192 may be formed along the profile of the first lower electrode 191. The first upper electrode 193 may be formed on the first capacitor dielectric film 192. The first upper electrode 193 may be on outer walls of the first lower electrode 191.

As an example, the first capacitor dielectric film 192 may be placed in a portion that vertically overlaps the first upper electrode 193. As another example, unlike the shown case, the first capacitor dielectric film 192 may include a first portion that vertically overlaps the first upper electrode 193, and a second portion that does not vertically overlap the first upper electrode 193. That is, the second portion of the first capacitor dielectric film 192 is a portion that is not covered with the first upper electrode 193.

Each of the first lower electrode 191 and the first upper electrode 193 may include, for example, but is not limited to, a doped semiconductor material, a conductive metal nitride (e.g., titanium nitride, tantalum nitride, niobium nitride and/or tungsten nitride), a metal (e.g., ruthenium, iridium, titanium and/or tantalum), and/or a conductive metal oxide (e.g., iridium oxide or niobium oxide).

The first capacitor dielectric film 192 may include, but is not limited to, for example, one of silicon oxide, silicon nitride, silicon oxynitride, high dielectric constant materials, and combinations thereof. In the semiconductor device according to some embodiments, the first capacitor dielectric film 192 may include a stacked film structure in which zirconium oxide, aluminum oxide, and zirconium oxide are sequentially stacked. In the semiconductor device according to some embodiments, the first capacitor dielectric film 192 may include a dielectric film including hafnium (Hf). In the semiconductor device according to some embodiments, the first capacitor dielectric film 192 may have a stacked film structure of a ferroelectric material film and a paraelectric material film.

A peri element isolation film 26 may be formed inside the substrate 100 of the peri region 24. The peri element isolation film 26 may define a peri active region inside the peri region 24. Although the upper face of the peri element isolation film 26 is shown as being placed on the same plane as the upper face of the substrate 100, the embodiments of the present disclosure are not limited thereto. The peri element isolation film 26 may include, for example, but is not limited to, at least one of a silicon oxide film, a silicon nitride film and/or a silicon oxynitride film.

A peri gate structure 240ST may be placed on the substrate 100 of the peri region 24. The peri gate structure 240ST may be placed on the peri active region defined by the peri element isolation film 26.

The peri gate structure 240ST may include a peri gate insulating film 230, a peri gate conduction film 240, and a peri capping film 244 which are sequentially stacked on the substrate 100. The peri gate structure 240ST may include a peri spacer 245 placed on the side wall of the peri gate conduction film 240 and on the side wall of the peri capping film 244.

The peri gate conduction film 240 may include first to third peri conductive films 241, 242, and 243 which are sequentially stacked on the peri gate insulating film 230. As an example, an additional conductive film may not be placed between the peri gate conduction film 240 and the peri gate insulating film 230. As another example, unlike the shown case, an additional conductive film, such as a work function conductive film, may be placed between the peri gate conduction film 240 and the peri gate insulating film 230.

Although two peri gate structures 240ST are shown as being placed between the adjacent peri element isolation films 26, this is only for convenience of explanation, and the embodiments of the present disclosure are not limited thereto.

A first block conduction structure 240ST_1 may be placed between the cell region 20 and the peri region 24. Although a part of the first block conduction structure 240ST_1 is shown to overlap the cell region isolation film 22, the embodiments of the present disclosure are not limited thereto. The first block conduction structure 240ST_1 may be a conductive structure which is closest to the bit line structure 140ST, which extends in the second direction D2, in the second direction D2.

The first block conduction structure 240ST_1 may include a first block gate insulating film 230_1, a first block conduction line 240_1, and a first block capping film 244_1, which are sequentially stacked on the substrate 100. The first block conduction structure 240ST_1 may include a first block spacer 245_1 placed on the side wall of the first block conduction line 240_1 and the side wall of the first block capping film 244_1.

The first block conduction line 240_1 may include first_1 to first_3 block conductive films 241_1, 242_1, and 243_1 which are sequentially stacked on the first block gate insulating film 230_1. The stacked film structure of the first block conduction line 240_1 between the first block gate insulating film 230_1 and the first block capping film 244_1 may be the same as the stacked film structure of the peri gate conduction film 240.

A second block conduction structure 240ST_2 may be placed between the cell region 20 and the peri region 24. Although a part of the second block conduction structure 240ST_2 is shown to overlap the cell region isolation film 22, the embodiments of the present disclosure are not limited thereto. The second block conduction structure 240ST_2 may be a conductive structure that is closest to the dummy bit line structure 140ST_1 in the first direction D1.

The second block conduction structure 240ST_2 may include a second block gate insulating film 230_2, a second block conduction line 240_2, and a second block capping film 244_2, which are sequentially stacked on the substrate 100. The second block conduction structure 240ST_2 may include a second block spacer 245_2 placed on the side wall of the second block conduction line 240_2 and the side wall of the second block capping film 244_2.

The second block conduction line 240_2 may include second_1 to second_3 block conductive films 241_2, 242_2, and 243_2 which are sequentially stacked on the second block gate insulating film 230_2. The stacked film structure of the second block conduction line 240_2 between the second block gate insulating film 230_2 and the second block capping film 244_2 may be the same as the stacked film structure of the peri gate conduction film 240.

The peri gate structure 240ST, the first block conduction structure 240ST_1, and the second block conduction structure 240ST_2 may be formed at the same level. The peri gate conduction film 240, the first block conduction line 240_1, and the second block conduction line 240_2 may have the same stacked structure as the cell conduction line 140. For example, a thickness T21 of the peri gate conduction film 240 may be the same as a thickness T11 of the cell conduction line 140.

The first peri conductive film 241, the first_1 block conductive film 241_1, and the second_1 block conductive film 241_2 may include the same materials as the first cell conduction film 141. The second peri conductive film 242, the first_2 block conductive film 242_1, and the second_2 block conductive film 242_2 may include the same materials as the second cell conduction film 142. The third peri conductive film 243, the first_3 block conductive film 243_1, and the second_3 block conductive film 243_2 may include the same materials as the third cell conduction film 143.

The peri gate insulating film 230, the first block gate insulating film 230_1, and the second block gate insulating film 230_2 may include the same material. The peri gate insulating film 230, the first block gate insulating film 230_1, and the second block gate insulating film 230_2 may include, for example, silicon oxide, silicon nitride, silicon oxynitride, and/or a high dielectric constant material having a higher dielectric constant than silicon oxide.

The peri spacer 245, the first block spacer 245_1, and the second block spacer 245_2 may include the same material. The peri spacer 245, the first block spacer 245_1, and the second block spacer 245_2 may include, for example, at least one of silicon nitride, silicon oxynitride, silicon oxide, silicon carbonitride, silicon oxycarbonitride, and a combination thereof. Although the peri spacer 245, the first block spacer 245_1, and the second block spacer 245_2 are shown as a single film, this is only for convenience of explanation, and the embodiments of the present disclosure are not limited thereto. It is a matter of course that the peri spacer 245, the first block spacer 245_1, and the second block spacer 245_2 may be or include a multi-film structure.

The peri capping film 244, the first block capping film 244_1 and the second block capping film 244_2 may include the same material. The peri capping film 244, the first block capping film 244_1, and the second block capping film 244_2 may include, for example, at least one of silicon nitride film, silicon oxynitride and/or silicon oxide.

For example, a thickness T22 of the peri capping film 244 is smaller than the thickness T12 of the cell line capping film 144. Further, the upper face 244US of the peri capping film is lower than the upper face 144US of the cell line capping film, on the basis of (e.g., with respect to) the upper face of the substrate 100. The pad isolation insulating film 180 may be formed at a position from which a part of the cell line capping film 144 is removed. Therefore, as shown in FIGS. 4, 6 and 7, the thicknesses of the cell line capping films 144 may appear differently from each other in cross-sections taken from different directions and different regions. In the semiconductor memory device according to some embodiments, the thickness T12 of the cell line capping film 144 may be the thickness of the cell line capping film 144 on the cell conduction line 140 shown in FIG. 4. FIG. 4 may be a cross-sectional view taken in the first direction D1 between the cell gate structures 110 adjacent in the second direction D2 in the cell region 20.

A second etching stop film 250 may be placed on the substrate 100. The second etching stop film 250 may be formed along the profile of the peri gate structure 240ST, the profile of the first block conduction structure 240ST_1, and the profile of the second block conduction structure 240ST_2. The second etching stop film 250 may extend along the side walls of the first cell boundary spacer 246_1 and the second cell boundary spacer 246_2.

The second etching stop film 250 may include, for example, at least one of silicon nitride film, silicon oxynitride, silicon carbonitride and/or silicon oxycarbonitride.

A first peri interlayer insulating film 290 may be placed on the second etching stop film 250. The first peri interlayer insulating film 290 may be placed around the peri gate structure 240ST.

A cell interlayer insulating film 295 may be placed on the second etching stop film 250. For example, the cell interlayer insulating film 295 may be placed on the cell region isolation film 22. The cell interlayer insulating film 295 may be placed between the first block conduction structure 240ST_1 and the bit line structure 140ST, and between the second block conduction structure 240ST_2 and the dummy bit line structure 140ST_1. The cell interlayer insulating film 295 may be placed between the cell conduction line 140 and the first block conduction line 240_1 facing each other in the second direction D2, and between the second block conduction line 240_2 and the cell conduction line of the dummy bit line structure 140ST_1 facing ech other in the first direction D1. The cell interlayer insulating film 295 may be placed around the bit line structure 140ST and the dummy bit line structure 140ST_1.

The first peri interlayer insulating film 290 and the cell interlayer insulating film 295 may be formed at the same level. The first peri interlayer insulating film 290 and the cell interlayer insulating film 295 may include the same material. The first peri interlayer insulating film 290 and the cell interlayer insulating film 295 may include, for example, an oxide-based insulating material.

For example, the peri gate structure 240ST may include a first peri gate structure and a second peri gate structure that are placed in the adjacent peri element isolation film 26. The first peri gate structure is spaced apart from the second peri gate structure. Further, the peri gate structure 240ST may include a third peri gate structure spaced apart from the first peri gate structure with the peri element isolation film 26 interposed therebetween. The first to third peri gate structures each include a peri gate insulating film 230, a peri gate conduction film 240, a peri capping film 244, and a peri spacer 245.

The peri gate conduction film 240 included in the first peri gate structure may be spaced apart from the peri gate conduction film 240 included in the second peri gate structure by a first distance L1. The peri gate conduction film 240 included in the first peri gate structure may be spaced apart from the peri gate conduction film 240 included in the third peri gate structure by a second distance L2. In the semiconductor memory device according to some embodiments, the first distance L1 may be different from the second distance L2. For example, the first distance L1 is smaller than the second distance L2.

The height of the upper face 290US of the first peri interlayer insulating film 290 may be a first height H1, between the peri gate conduction film 240 included in the first peri gate structure and the peri gate conduction film 240 included in the second peri gate structure on the basis of the upper face of the substrate 100. The height of the upper face 290US of the first peri interlayer insulating film 290 may be a second height H2, between the peri gate conduction film 240 included in the first peri gate structure and the peri gate conduction film 240 included in the third peri gate structure on the basis of the upper face of the substrate 100. The height of upper face 244US of the peri capping film 244 of the first to third peri gate structures may be a third_1 height H31, on the basis of the upper face of the substrate 100. The height of an uppermost part of the peri spacer 245 of the first to third peri gate structures may be a third_2 height H32, on the basis of the upper face of the substrate 100.

The upper face 290US of the first peri interlayer insulating film may be lower than the upper face 244US of the peri capping film 244, on the basis of the upper face of the substrate 100. For example, the third_1 height H31 may be greater than the first height H1 and the second height H2. In the semiconductor device according to some embodiments, the first height H1 may be the same as the second height H2.

On the basis of the upper face of the substrate 100, the upper face 290US of the first peri interlayer insulating film 290 may be lower than the uppermost part of the peri spacer 245. As an example, the third_1 height H31 may be the same as the third_2 height H32. In such a case, the third_2 height H32 is greater than the first height H1 and the second height H2.

As another example, unlike the shown case, the uppermost part of the peri spacer 245 may become lower than the upper face 244US of the peri capping film 244, by an etching process during the fabricating process. In such a case, the third_2 height H32 may be greater than or equal to the first height H1 and the second height H2.

The height of the upper face 295US of the cell interlayer insulating film 295 between the first block conduction structure 240ST_1 and the bit line structure 140ST may be a fourth height H4, on the basis of the upper face of the substrate 100. The height of the upper face 295US of the cell interlayer insulating film 295 between the second block conduction structure 240ST_2 and the dummy bit line structure 140ST_1 may be a fifth height H5, on the basis of the upper face of the substrate 100.

The upper face 295US of the cell interlayer insulating film 295 may be lower than the upper face 244US_1 of the first block capping film 244_1, on the basis of the upper face of the substrate 100. The upper face 295US of the cell interlayer insulating film 295 may be lower than the upper face 244US_2 of the second block capping film 244_2, on the basis of the upper face of the substrate 100.

In the semiconductor memory device according to some embodiments, the fourth height H4 may be the same as the fifth height H5. In the semiconductor memory device according to some embodiments, the fourth height H4 may be the same as the first height H1 and the second height H2.

An insertion interlayer insulating film 291 may be on the peri gate structure 240ST, the first peri interlayer insulating film 290, and the cell interlayer insulating film 295. The insertion interlayer insulating film 291 may be on and/or cover the peri gate structure 240ST, the first peri interlayer insulating film 290, and the cell interlayer insulating film 295. The insertion interlayer insulating film 291 may be on and/or cover the second etching stop film 250 protruding upward from the upper face 290US of the first peri interlayer insulating film 290 and the upper face 295US of the cell interlayer insulating film 295.

Although the upper face 290US of the first peri interlayer insulating film 290 and the upper face 295US of the cell interlayer insulating film 295 are shown as a plane, the embodiments of the present disclosure are not limited thereto. The upper face 290US of the first peri interlayer insulating film 290 and the upper face 295US of the cell interlayer insulating film 295 may each be a curved face that is convex toward the substrate 100. In such a case, a reference point for a height of the upper face 290US of the first peri interlayer insulating film 290 and the upper face 295US of the cell interlayer insulating film 295 may be a portion that is closest to the substrate 100.

The insertion interlayer insulating film 291 may include a material different from the first peri interlayer insulating film 290 and/or the cell interlayer insulating film 295. The insertion interlayer insulating film 291 may include, for example, a nitride-based insulating material. For example, the insertion interlayer insulating film 291 may include silicon nitride.

A part of the insertion interlayer insulating film 291 may be indented between the adjacent peri gate structures 240ST. That is, the lower face of the insertion interlayer insulating film 291 may be lower than the upper face 244US of the peri capping film 244, on the basis of the upper face of the substrate 100.

Therefore, in an etching process included in the procedure for fabricating the information storage part 190, the insertion interlayer insulating film 291 may protect the first peri interlayer insulating film 290. In the etching process included in the procedure for fabricating the information storage part 190, the insertion interlayer insulating film 291 may prevent and/or reduce defects generated by etching the first peri interlayer insulating film 290.

A peri contact plug 260 may be placed on either side of the peri gate structure 240ST. The peri contact plug 260 may penetrate the insertion interlayer insulating film 291 and the first peri interlayer insulating film 290 and extend to the substrate 100 of the peri region 24.

A peri wiring line 265 may be placed on the insertion interlayer insulating film 291. A bit line contact plug 261 may pass through the cell line capping film 144 and be connected to the cell conduction line 140. A cell gate contact plug 262 may pass through the insertion interlayer insulating film 291, the cell interlayer insulating film 295, and the cell gate capping pattern 113, and be connected to the cell gate electrode 112.

The peri contact plug 260, the peri wiring line 265, the bit line contact plug 261, and/or the cell gate contact plug 262 may include the same material as the storage pad 160.

A peri wiring isolation pattern 280 may separate the peri wiring line 265 and the peri contact plug 260. The peri wiring isolation pattern 280 may include, for example, at least one of a silicon oxide film, a silicon nitride film, a silicon oxynitride film, a silicon oxycarbonitride film, and/or a silicon carbonitride film.

A first etching stop film 292 may be placed on the peri contact plug 260, the peri wiring line 265, the bit line contact plug 261, and the cell gate contact plug 262.

A second peri interlayer insulating film 293 may be placed on the first etching stop film 292. The second peri interlayer insulating film 293 may be on and/or cover the side wall of the first upper electrode 193. The second peri interlayer insulating film 293 may include an insulating material.

Figure 9:
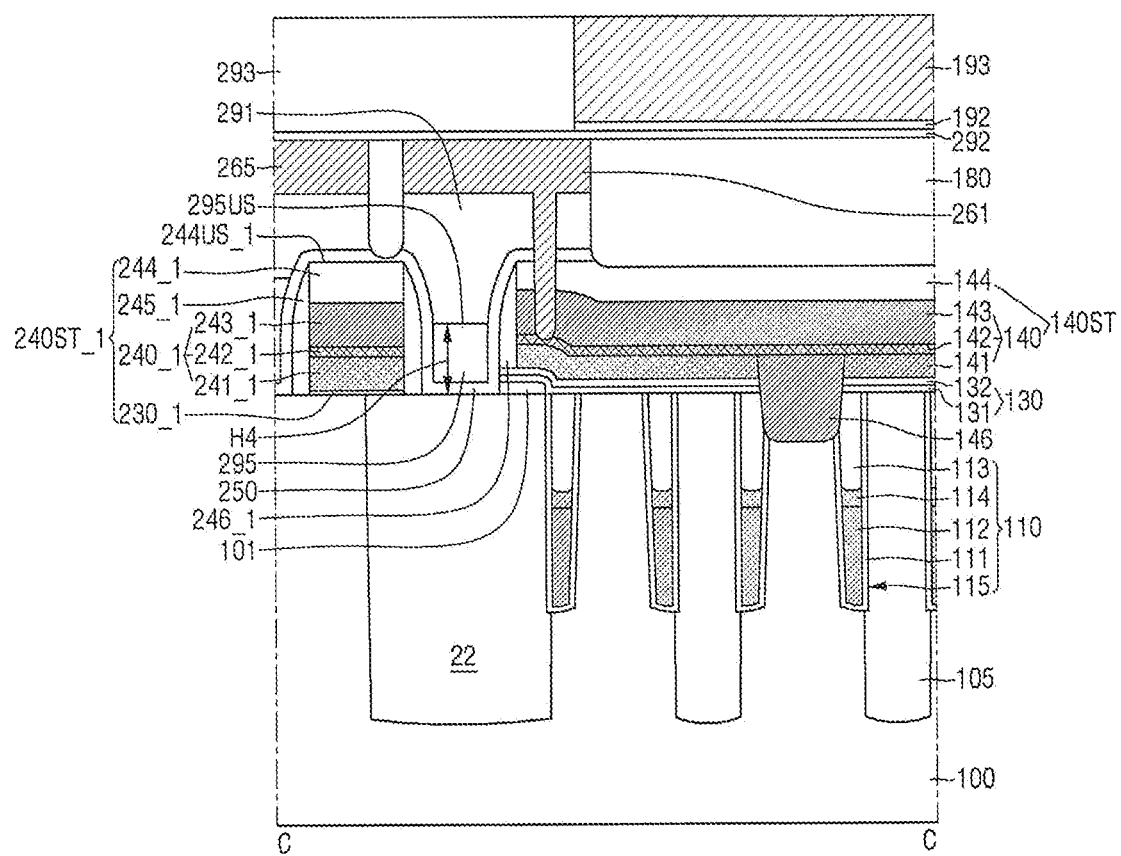
FIG. 9 is a diagram taken along the line C-C of FIG. 2 for explaining the semiconductor memory device according to some embodiments of the present disclosure.
Figure 10:
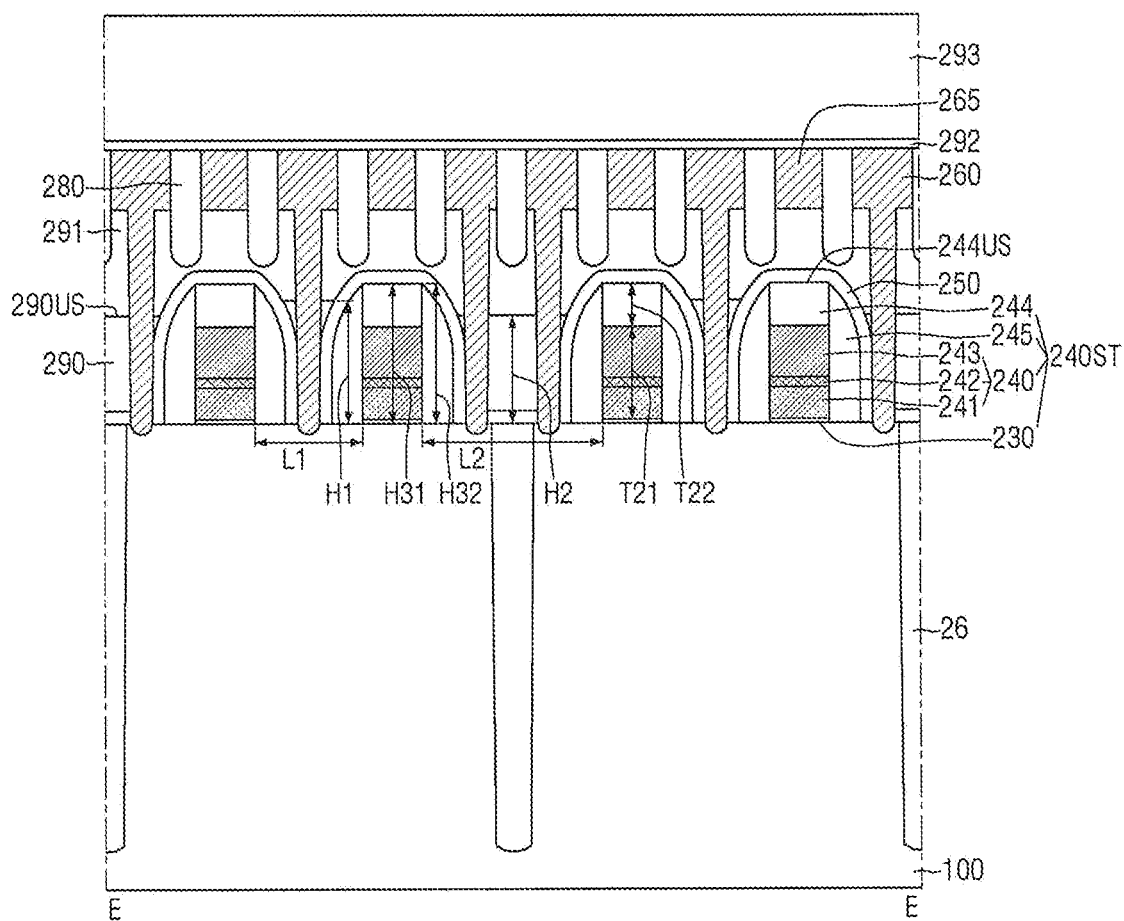
FIG. 10 is a diagram taken along the line E-E of FIG. 2 for explaining the semiconductor memory device according to some embodiments of the present disclosure.

FIG. 9 is a diagram for explaining the semiconductor memory device according to some embodiments of the present disclosure. FIG. 10 is a diagram for explaining the semiconductor memory device according to some embodiments of the present disclosure. For convenience of explanation, the points different from those explained using FIGS. 1 to 8 will be mainly described.

For reference, FIG. 9 is a cross-sectional view taken along C-C of FIG. 2, and FIG. 10 is a cross-sectional view taken along E-E of FIG. 2.

Referring to FIGS. 8 and 9, in the semiconductor device according to some embodiments, the upper face 290US of the first peri interlayer insulating film 290 may be higher than the upper face 295US of the cell interlayer insulating film 295 between the first block conduction structure 240ST_1 and the bit line structure 140ST, on the basis of the upper face of the substrate 100.

The heights H1, H2 of the upper face 290US of the first peri interlayer insulating film 290 may be greater than the height H4 of the upper face 295US of the cell interlayer insulating film 295 between the first block conduction structure 240ST_1 and the bit line structure 140ST, on the basis of the upper face of the substrate 100.

Referring to FIG. 10, in the semiconductor memory device according to some embodiments, the height H1 of the upper face 290US of the first peri interlayer insulating film 290 between the peri gate conduction films 240 separated by the first distance L1 may be different from the height H2 of the upper face 290US of the first peri interlayer insulating film 290 between the peri gate conduction films 240 separated by the second distance L2.

For example, the height H1 of the upper face 290US of the first peri interlayer insulating film 290 between the first peri gate structure and the second peri gate structure is greater than the height H2 of the upper face 290US of the first peri interlayer insulating film 290 between the first peri gate structure and the third peri gate structure.

In some embodiments, as the distance between the adjacent peri gate conduction films 240 increases, the height of the upper face 290US of the first peri interlayer insulating film 290 between the adjacent peri gate conduction films 240 may decrease, on the basis of the upper face of the substrate 100.

Although it is not shown, as an example, with a change in the spaced distance between the first block conduction structure 240ST_1 and the bit line structure 140ST in the second direction D2, the height H4 of the upper face 295US of the cell interlayer insulating film 295 may also change between the first block conduction structure 240ST_1 and the bit line structure 140ST. As another example, with a change in the spaced distance between the second block conduction structure 240ST_2 and the dummy bit line structure 140ST_1 in the first direction D1, the height H5 of the upper face 295US of the cell interlayer insulating film 295 may also change between the second block conduction structure 240ST_2 and the dummy bit line structure 140ST_1.

Figure 11:
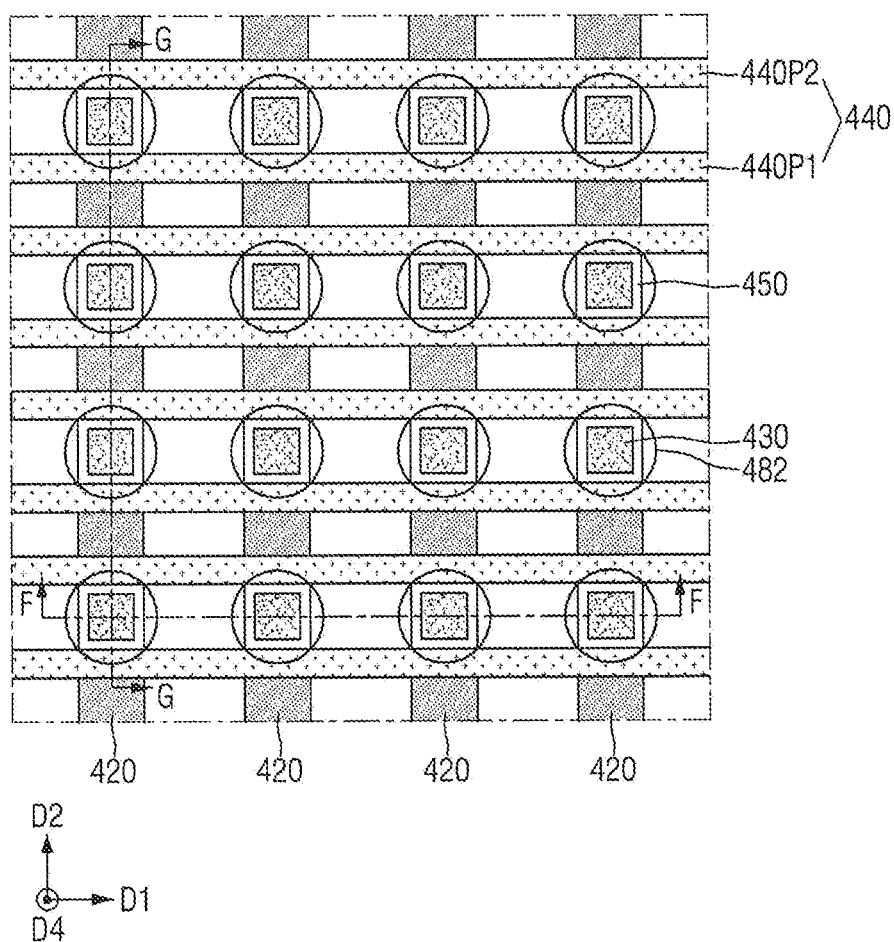
FIG. 11 is a layout diagram for explaining the semiconductor memory device according to some embodiments of the present disclosure.
Figure 12:
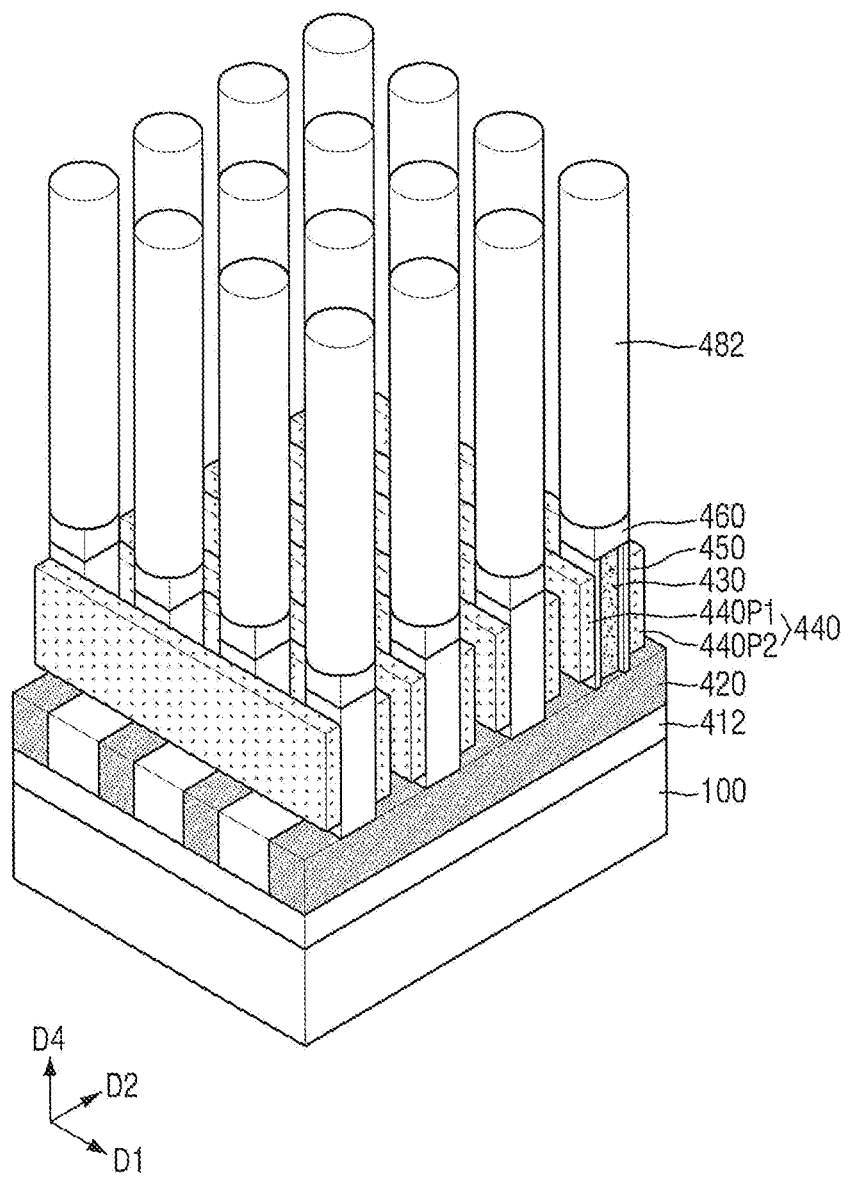
FIG. 12 is a perspective view for explaining the semiconductor memory device according to some embodiments of the present disclosure.
Figure 13:
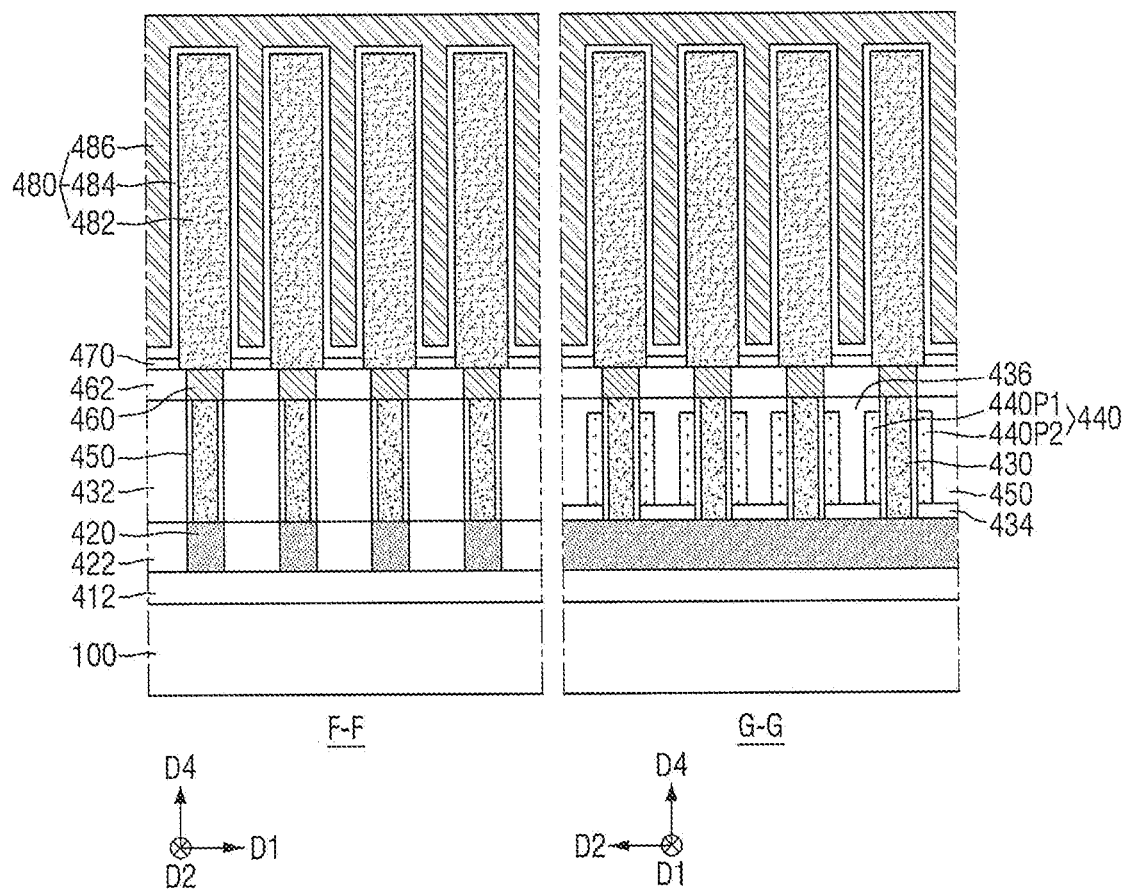
FIG. 13 is a cross-sectional view taken along lines F-F and G-G of FIG. 11.

FIG. 11 is a layout diagram for explaining the semiconductor memory device according to some embodiments of the present disclosure. FIG. 12 is a perspective view for explaining the semiconductor memory device according to some embodiments of the present disclosure. FIG. 13 is a cross-sectional view taken along the lines F-F and G-G of FIG. 11. For reference, FIG. 11 may be an enlarged view of the cell region 20 of FIG. 2. Further, in the semiconductor memory device in which FIG. 11 is applied to the cell region, the cross section (for example, C-C and D-D of FIG. 2) of the boundary portion of the cell region is different from that of FIGS. 6 and 7.

Referring to FIGS. 11 to 13, the semiconductor memory device according to some embodiments may include a substrate 100, a plurality of first conductive lines 420, a channel layer 430, a gate electrode 440, a gate insulating film 450 and a capacitor 480. The semiconductor memory device according to some embodiments may be a memory device that includes a vertical channel transistor VCT. The vertical channel transistor may refer to a structure in which a channel length of the channel layer 430 extends from the substrate 100 along the vertical direction.

A lower insulating layer 412 may be placed on the substrate 100. A plurality of first conductive lines 420 may be spaced apart from each other in the first direction D1 and extend in the second direction D2, on the lower insulating layer 412. A plurality of first insulating patterns 422 may be placed on the lower insulating layer 412 to fill the space between the plurality of first conductive lines 420. The plurality of first insulating patterns 422 may extend in the second direction D2. The upper face of the plurality of first insulating patterns 422 may be placed at the same level as the upper face of the plurality of first conductive lines 420. The plurality of first conductive lines 420 may function as bit lines.

The plurality of first conductive lines 420 may include a doped semiconductor material, a metal, a conductive metal nitride, a conductive metal silicide, a conductive metal oxide, or a combination thereof. For example, the plurality of first conductive lines 420 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. The plurality of first conductive lines 420 may include a single layer or multiple layers of the aforementioned materials. In some example embodiments, the plurality of first conductive lines 420 may include graphene, carbon nanotube, or a combination thereof.

The channel layers 430 may be arranged in a matrix form placed to be spaced apart in the first direction D1 and the second direction D2 on the plurality of first conductive lines 420. The channel layer 430 may have a first width along the first direction D1 and a first height along a fourth direction D4, and the first height may be greater than the first width. Here, the fourth direction D4 may be a direction that intersects the first direction D1 and the second direction D2, and is, for example, perpendicular to the upper face of the substrate 100. For example, although the first height may be about 2 to 10 times the first width, the embodiments of the present disclosure are not limited thereto. The bottom portion of the channel layer 430 may function as a third source/drain region (not shown), the upper portion of the channel layer 430 may function as a fourth source/drain region (not shown), and a part of the channel layer 430 between the third and fourth source/drain regions may function as a channel region (not shown).

In some example embodiments, the channel layer 430 may include an oxide semiconductor, and for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_x Ga_yZn_zO$, $In_xGa_yO$, or a combination thereof. The channel layer 430 may include a single layer or multiple layers of the oxide semiconductor. In some embodiments, the channel layer 430 may have a bandgap energy greater than the bandgap energy of silicon. For example, the channel layer 430 may have a bandgap energy of about 1.5 eV to 5.6 eV. For example, the channel layer 430 may have optimum channel performance when it has a bandgap energy of about 2.0 eV to 4.0 eV. For example, the channel layer 430 may be, but is not limited to, polycrystalline or amorphous. In some example embodiments, the channel layer 430 may include graphene, carbon nanotube, or a combination thereof.

The gate electrode 440 may extend in the first direction D1 on both side walls of the channel layer 430. The gate electrode 440 may include a first sub-gate electrode 440P1 facing a first side wall of the channel layer 430, and a second sub-gate electrode 440P2 facing the second side wall opposite to the first side wall of the channel layer 430. As a single channel layer 430 is placed between the first sub-gate electrode 440P1 and the second sub-gate electrode 440P2, the semiconductor device may have a dual gate transistor structure. However, the technical idea of the present disclosure is not limited thereto. In some embodiments, the second sub-gate electrode 440P2 is omitted, and only the first sub-gate electrode 440P1 facing the first side wall of the channel layer 430 is formed to provide a single gate transistor structure. The material included in the gate electrode 440 may be the same as described with respect to the cell gate electrode 112.

The gate insulating film 450 may be on and/or surround the side walls of the channel layer 430 and may be interposed between the channel layer 430 and the gate electrode 440. For example, as shown in FIG. 11, the side walls of the channel layer 430 may be surrounded by the gate insulating film 450, and a part of the side walls of the gate electrode 440 may be in contact with the gate insulating film 450. In other embodiments, the gate insulating film 450 extends in an extension direction (i.e., the first direction D1) of the gate electrode 440, and only two side walls among the side walls of the channel layer 430, which face the gate electrode 440, may be in contact with the gate insulating film 450. In example embodiments, the gate insulating film 450 may be a silicon oxide film, a silicon oxynitride film, a high dielectric constant material having a higher dielectric constant than the silicon oxide film, or a combination thereof.

A plurality of second insulating patterns 432 may extend along the second direction D2 on the plurality of first insulating patterns 422. The channel layer 430 may be placed between two adjacent second insulating patterns 432 among the plurality of second insulating patterns 432. Further, between the two adjacent second insulating patterns 432, a first buried layer 434 and a second buried layer 436 may be placed in the space between the two adjacent channel layers 430. The first buried layer 434 may be located at the bottom portion of the space between the two adjacent channel layers 430. The second buried layer 436 may be formed on the first buried layer 434 to fill the rest of the space between the two adjacent channel layers 430. The upper face of the second buried layer 436 may be placed at the same level as the upper face of the channel layer 430, and the second buried layer 436 may be on and/or cover the upper face of the gate electrode 440. In some embodiments, a plurality of second insulating patterns 432 may be formed of a material layer that is continued and/or shared with a plurality of first insulating patterns 422, or the second buried layer 436 may also be formed of a material layer that is continued and/or shared with the first buried layer 434.

A capacitor contact 460 may be placed on the channel layer 430. The capacitor contact 460 may be disposed to vertically overlap the channel layer 430, and may be arranged in a matrix form that is spaced apart in the first direction D1 and the second direction D2. The capacitor contact 460 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. An upper insulating layer 462 may be on and/or surround the side walls of the capacitor contact 460, on the plurality of second insulating patterns 432 and the second buried layer 436.

A third etching stop film 470 may be placed on the upper insulating layer 462. A capacitor 480 may be placed on the third etching stop film 470. The capacitor 480 may include a second lower electrode 482, a second capacitor dielectric film 484, and a second upper electrode 486. The second lower electrode 482 may penetrate the etching stop film 470 and be electrically connected to the upper face of the capacitor contact 460. The second lower electrode 482 may be formed in, but is not limited to, a pillar type extending in the fourth direction D4. In example embodiments, the second lower electrode 482 is placed to vertically overlap the capacitor contact 460, and may be arranged in a matrix form spaced apart in the first direction D1 and the second direction D2. In some embodiments, a landing pad (not shown) may be further placed between the capacitor contact 460 and the second lower electrode 482, and the second lower electrode 482 may be a hexagonal shape.

Figure 14:
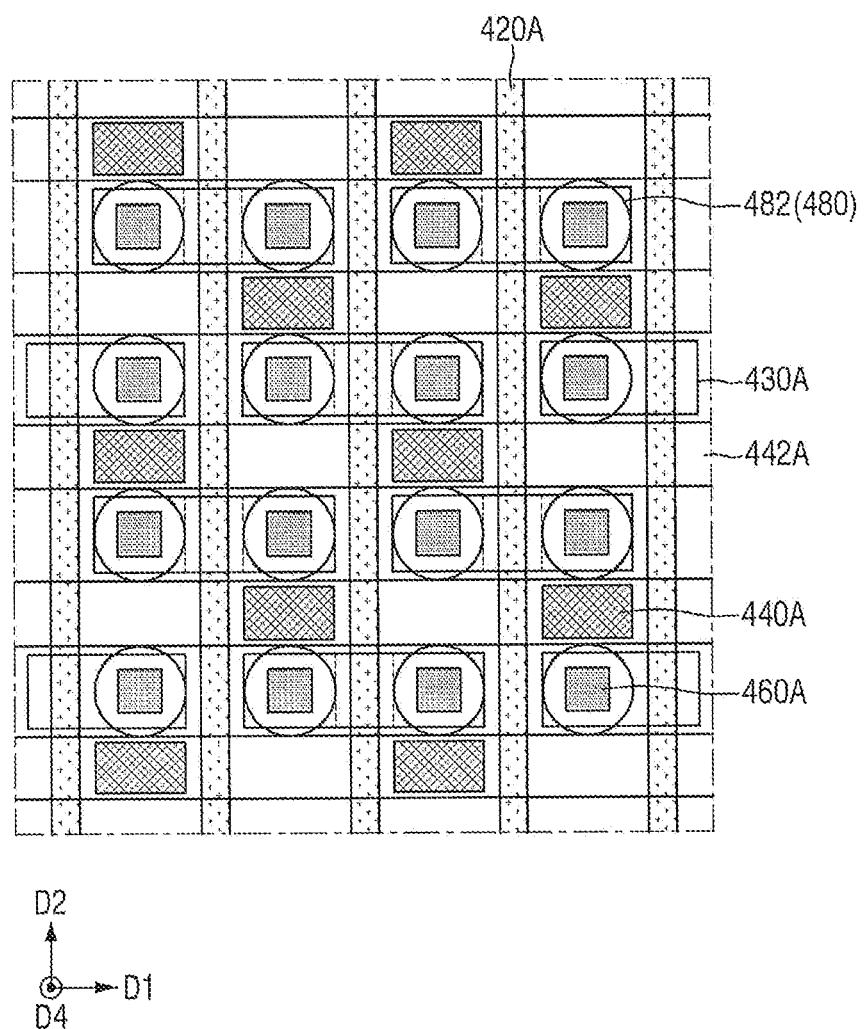
FIG. 14 is a layout diagram for explaining the semiconductor memory device according to some embodiments of the present disclosure.
Figure 15:
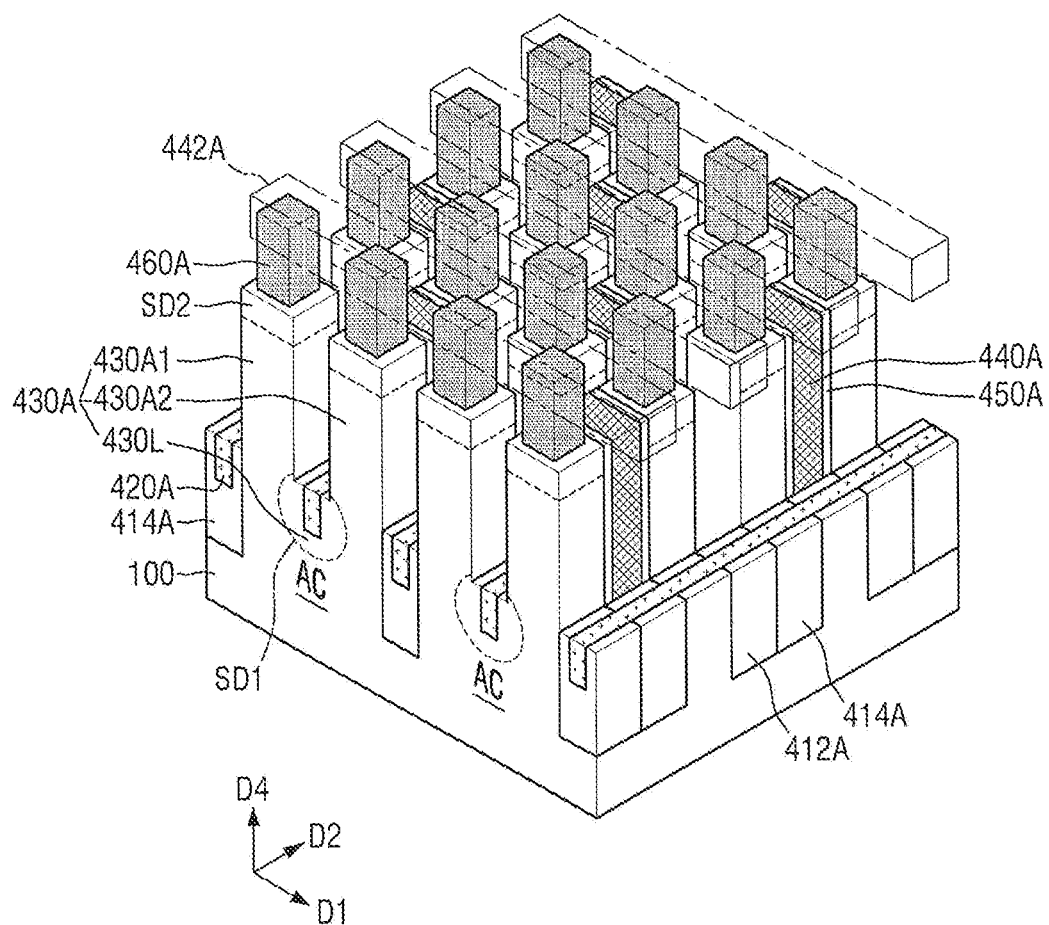
FIG. 15 is a perspective view for explaining the semiconductor memory device according to some embodiments of the present disclosure.
Figure 16A:
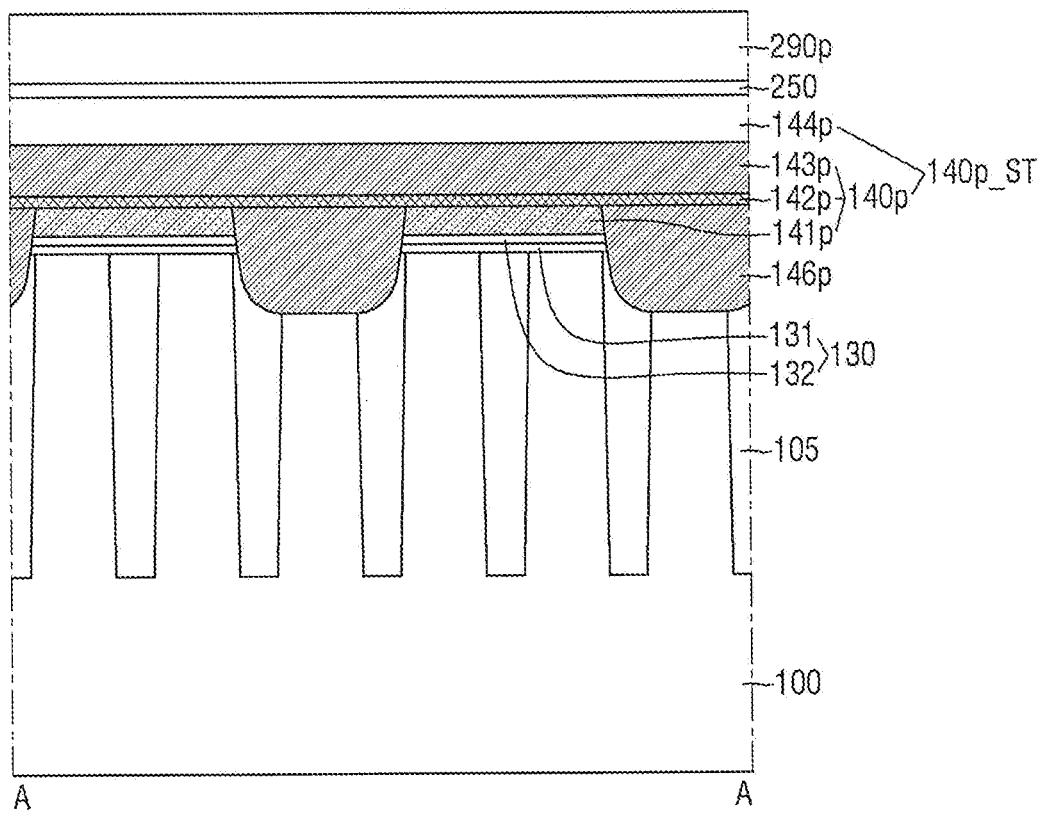
FIGS. 16A-16E, 17A-17E, 18A-18C, 19A-19E, 20A-20E, and 21A-21B are intermediate stage diagrams for explaining a method for fabricating the semiconductor memory device according to some embodiments of the present disclosure.
Figure 16B:
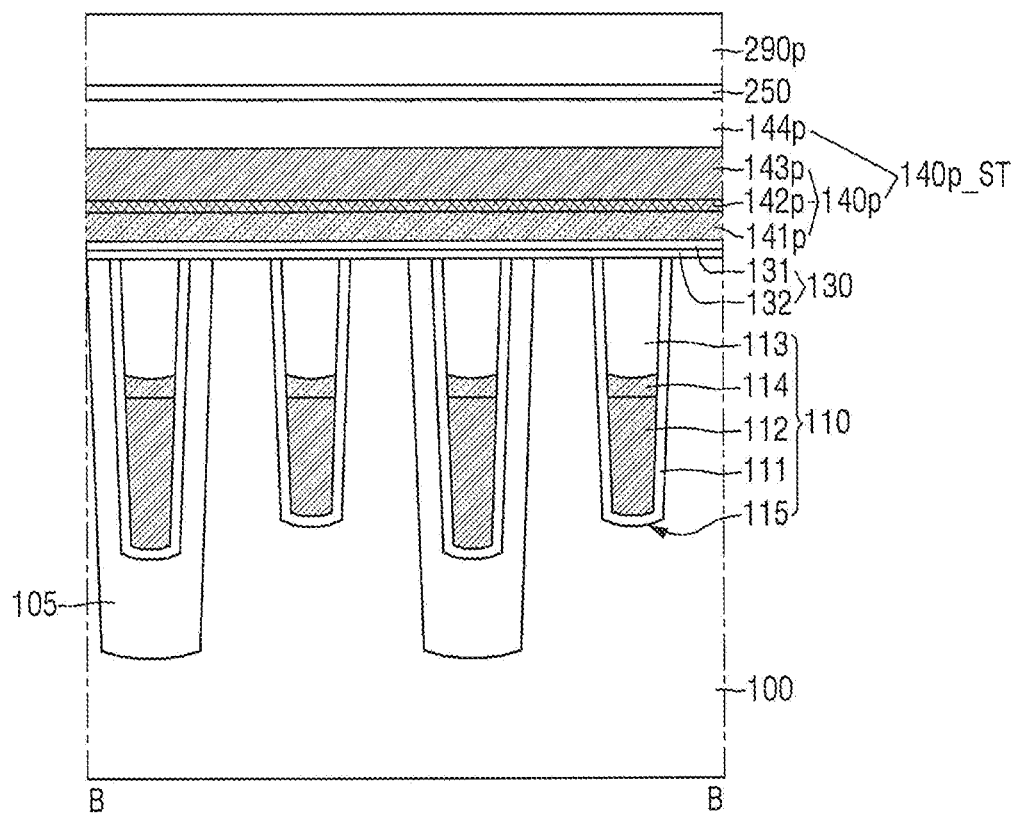
Figure 16C:
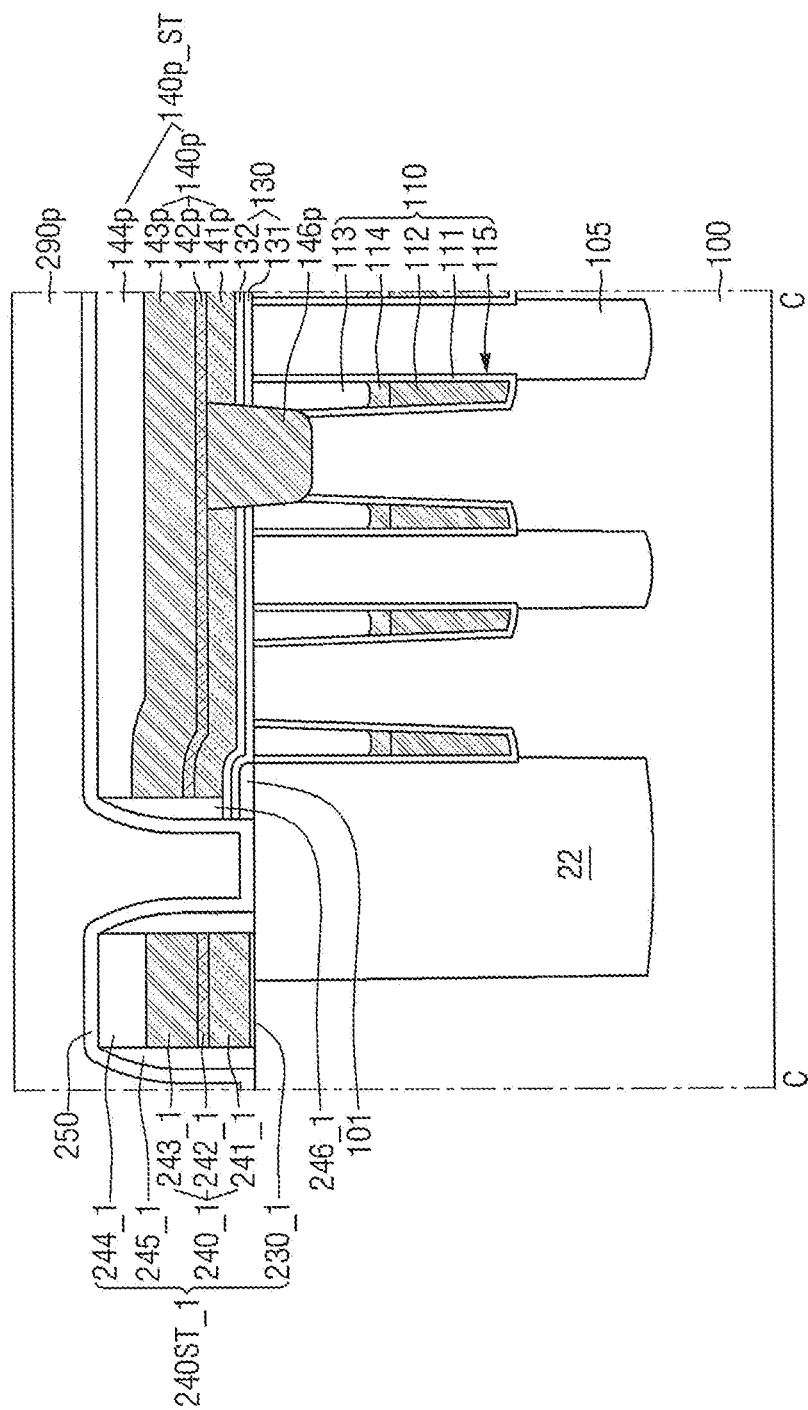
Figure 16D:
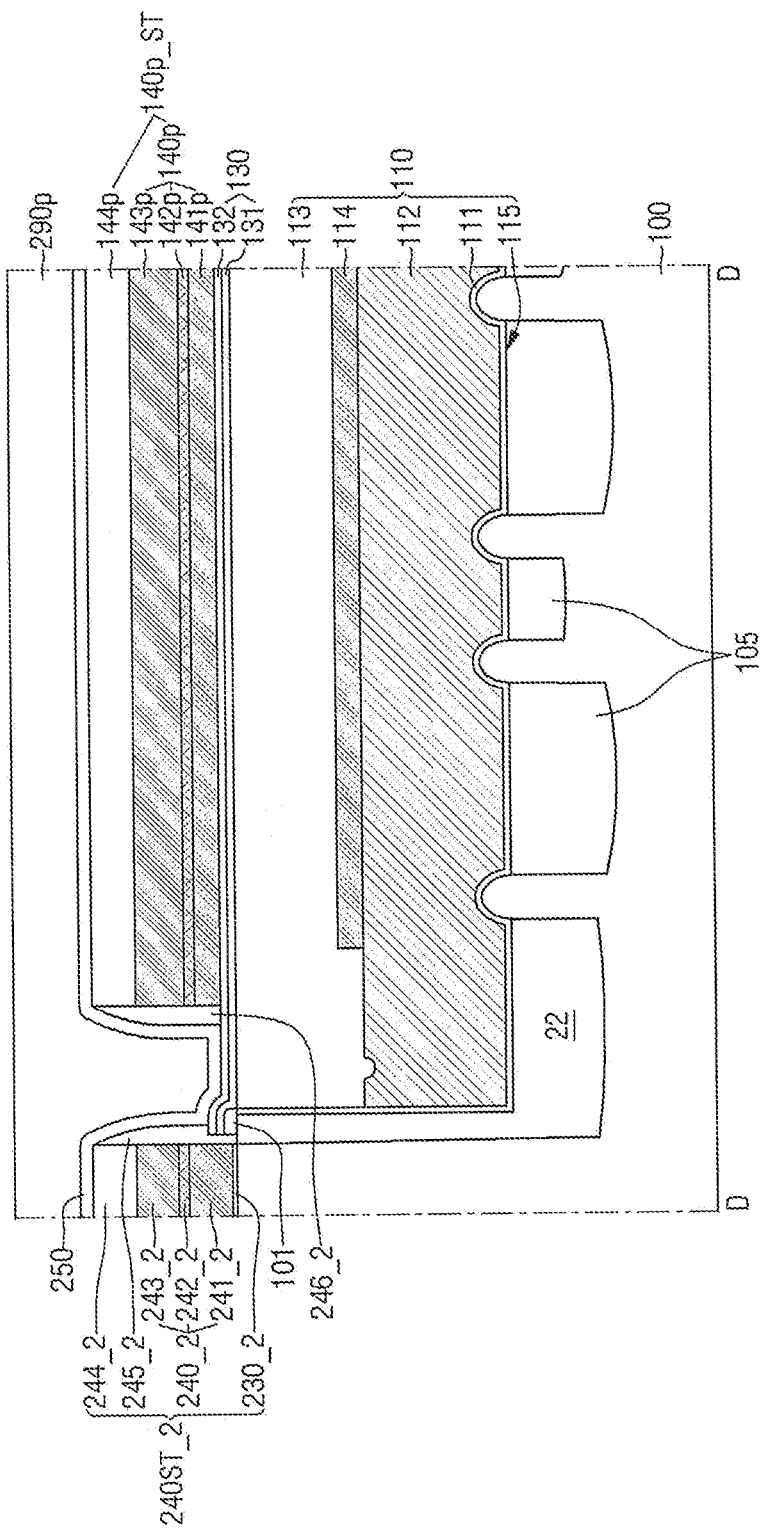
Figure 16E:
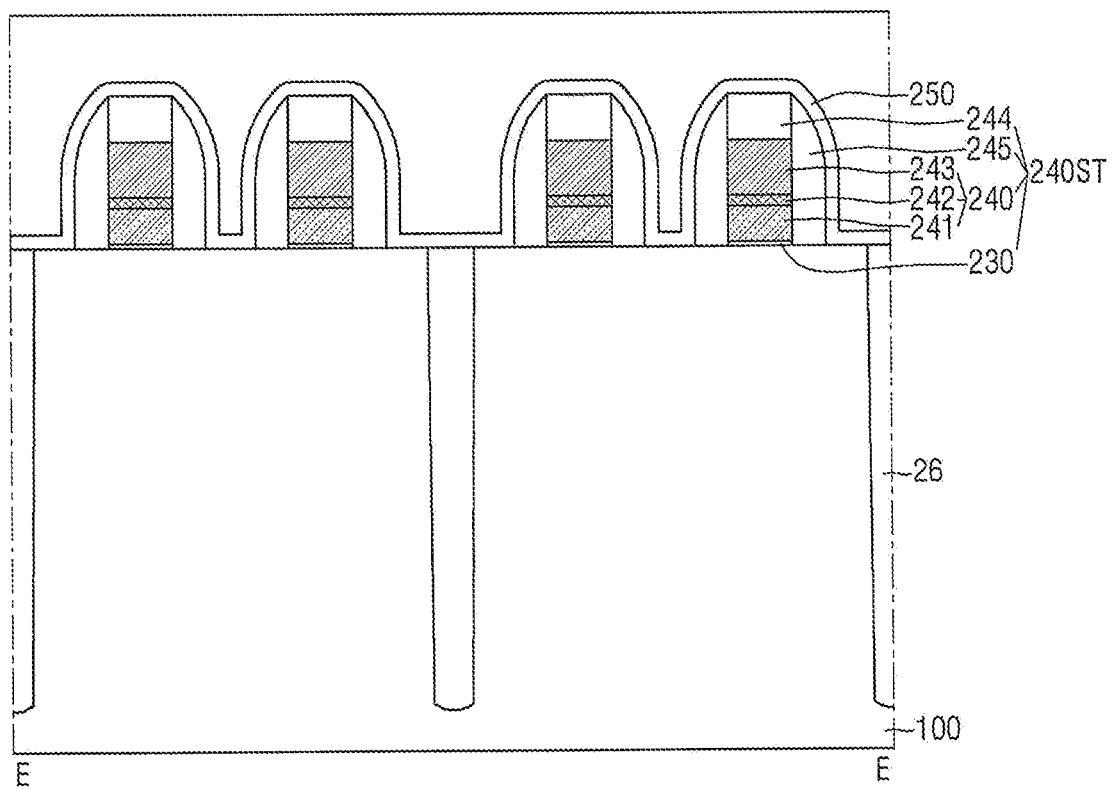
Figure 17A:
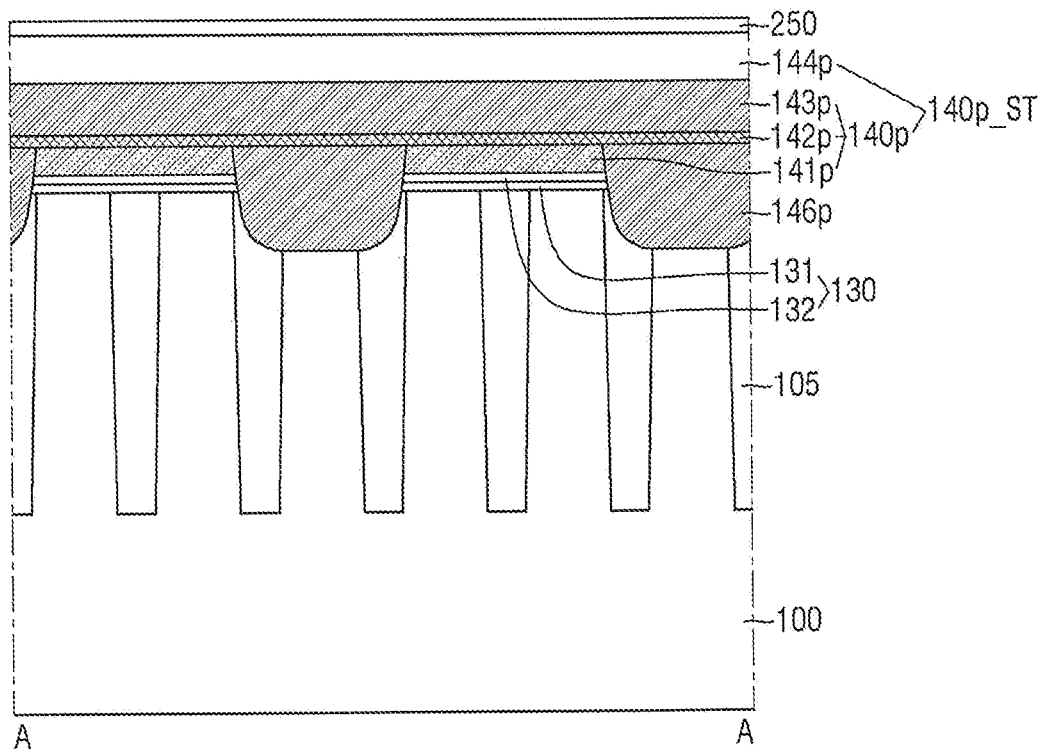
Figure 17B:
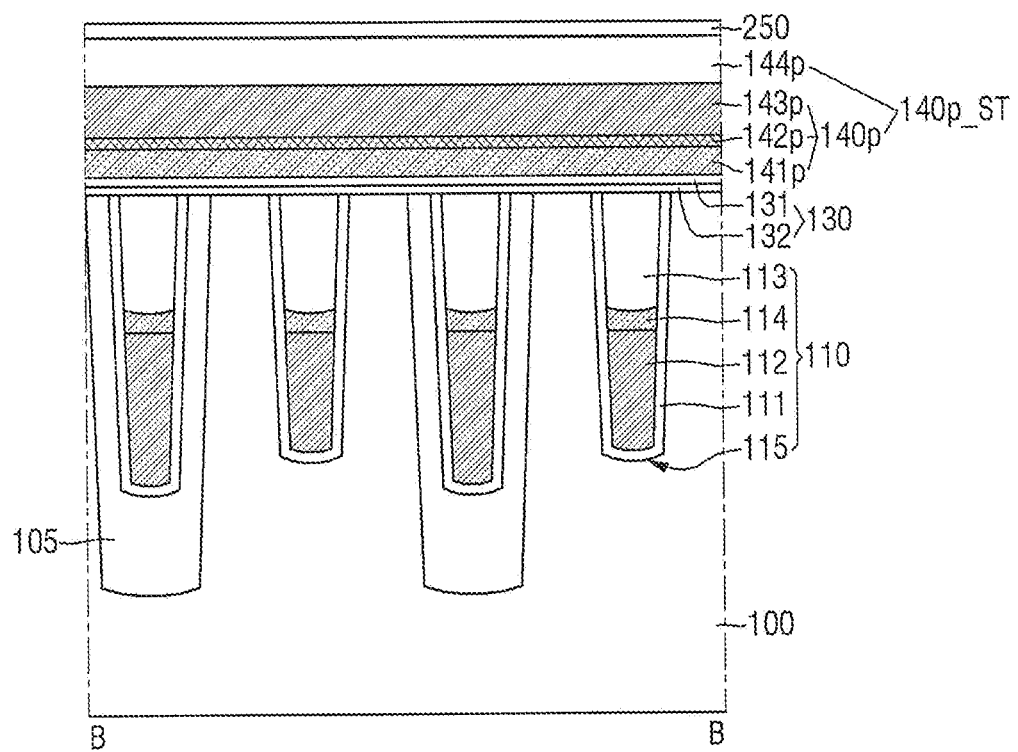
Figure 17C:
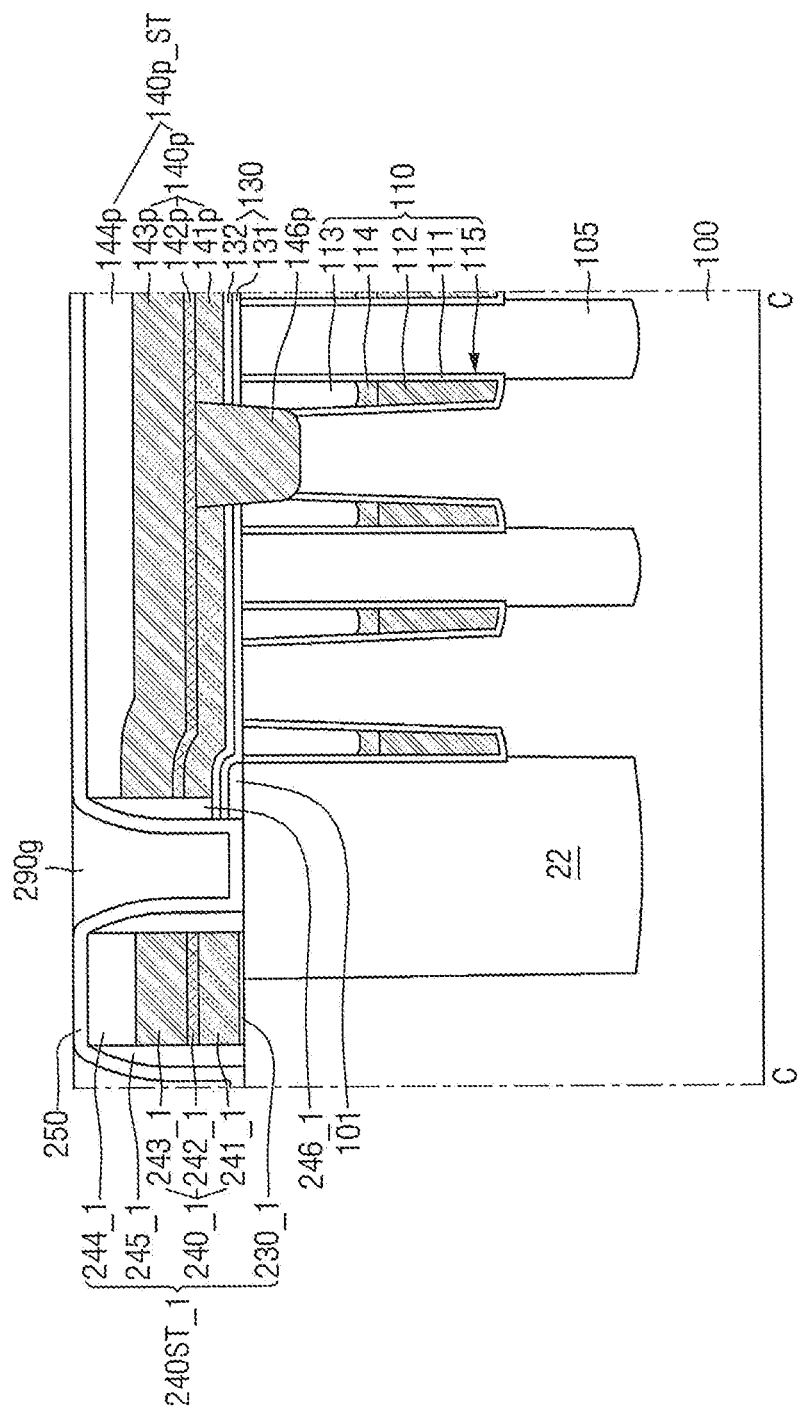
Figure 17D:
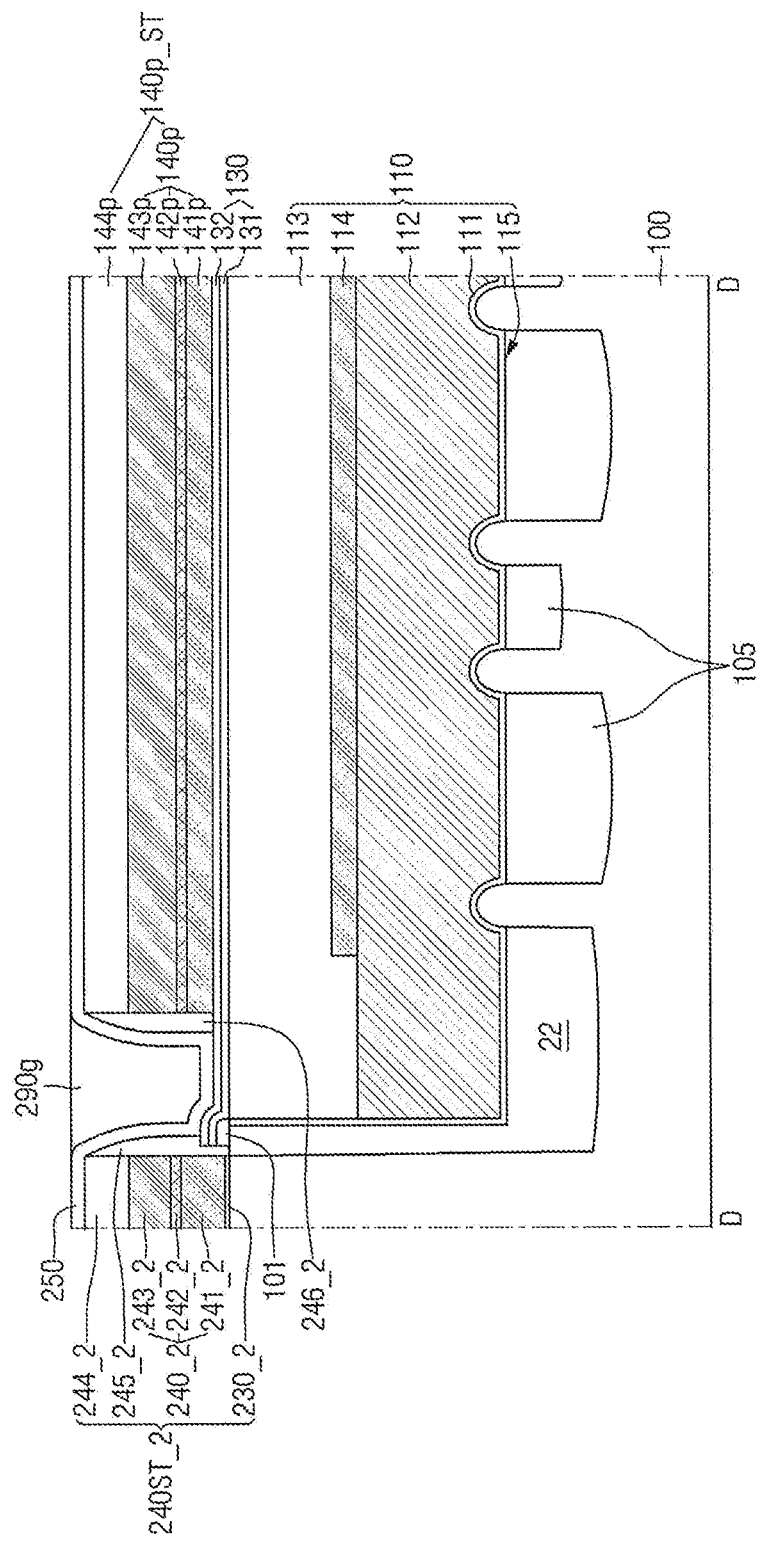
Figure 17E:
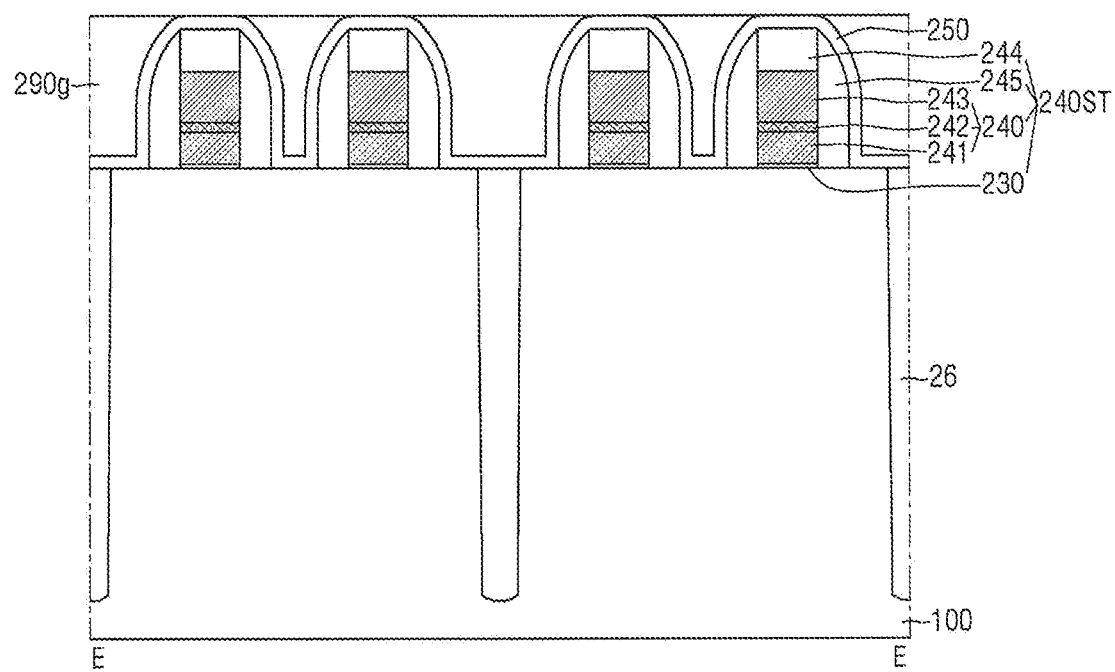

FIG. 14 is a layout diagram for explaining the semiconductor memory device according to some embodiments of the present disclosure. FIG. 15 is a perspective view for explaining the semiconductor memory device according to some embodiments of the present disclosure.

Referring to FIGS. 14 and 15, the semiconductor memory device according to some embodiments may include a substrate 100, a plurality of first conductive lines 420A, a channel structure 430A, a contact gate electrode 440A, a plurality of second conductive lines 442A, and a capacitor 480. The semiconductor memory device according to some embodiments may be a memory device that includes a vertical channel transistor VCT.

A plurality of second active regions AC may be defined on the substrate 100 by the first element isolation pattern 412A and the second element isolation pattern 414A. The channel structure 430A may be placed inside each second active region AC. The channel structure 430A may include a first active pillar 430A1 and a second active pillar 430A2 each extending in the vertical direction, and a connection 430L connected to the bottom portion of the first active pillar 430A1 and the bottom portion of the second active pillar 430A2. A first source/drain region SD1 may be disposed inside the connection 430L. A second source/drain region SD2 may be placed on the upper side of the first and second active pillars 430A1, 430A2. The first active pillar 430A1 and the second active pillar 430A2 may each form independent unit memory cells.

The plurality of first conductive lines 420A may extend in a direction intersecting each of the plurality of second active regions AC, and may extend, for example, in the second direction D2. One first conductive line 420A of the plurality of first conductive lines 420A may be placed on the connection 430L between the first active pillar 430A1 and the second active pillar 430A2. One first conductive line 420A may be placed on the first source/drain region SD1. The other first conductive line 420A adjacent to one first conductive line 420A may be placed between the two channel structures 430A. One first conductive line 420A of the plurality of first conductive lines 420A may function as a common bit line which is included in two unit memory cells formed by the first active pillar 430A1 and the second active pillar 430A2 placed on both sides of one first conductive line 420A.

One contact gate electrode 440A may be placed between the two channel structures 430A adjacent in the second direction D2. For example, a contact gate electrode 440A may be placed between the first active pillar 430A1 included in one channel structure 430A and the second active pillar 430A2 of the channel structure 430A adjacent thereto. One contact gate electrode 440A may be shared by the first active pillar 430A1 and the second active pillar 430A2 placed on both side walls thereof. A gate insulating film 450A may be placed between the contact gate electrode 440A and the first active pillar 430A1, and between the contact gate electrode 440A and the second active pillar 430A2. The plurality of second conductive lines 442A may extend in the first direction D1 on the upper face of the contact gate electrode 440A. The plurality of second conductive lines 442A may function as word lines of the semiconductor device.

A capacitor contact 460A may be placed on the channel structure 430A. The capacitor contact 460A may be placed on the second source/drain region SD2, and the capacitor 480 may be placed on the capacitor contact 460A.

FIGS. 16A to 21B are intermediate stage diagrams for explaining a method for fabricating the semiconductor memory device according to some embodiments of the present disclosure. In the explanation of the fabricating method, repeated contents of the contents explained using FIGS. 1 to 10 are briefly explained or omitted. FIGS. 16A, 17A, 19A, 20A, and 21A are cross-sectional views taken along line A-A of FIG. 1. FIGS. 16B, 17B, 19B, 20B, and 21B are cross-sectional views taken along line B-B of FIG. 1. FIGS. 16C, 17C, 18A, 19C, and 20C are cross-sectional views taken along line C-C of FIG. 2. FIGS. 16D, 17D, 18B, 19D, and 20D are cross-sectional views taken along line D-D of FIG. 2. FIGS. 16E, 17E, 18C, 19E, and 20E are cross-sectional views taken along line E-E of FIG. 2.

Referring to FIGS. 1, 2 and 16A to 16E, a substrate 100 including a cell region 20, a peri region 24, and a cell region isolation film 22 is provided.

The cell gate structure 110 may be formed inside the substrate 100 of the cell region 20. The cell gate structure 110 may have a longitudinal axis extending in the first direction D1. The cell gate structure 110 may include a cell gate trench 115, a cell gate insulating film 111, a cell gate electrode 112, a cell gate capping pattern 113, and a cell gate capping conductive film 114.

Subsequently, the cell insulating film 130 may be formed on the cell region 20. The cell insulating film 130 may expose the substrate 100 of the peri region 24.

Subsequently, a cell conduction film structure 140p_ST may be formed on the substrate 100 of the cell region 20. The cell conduction film structure 140p_ST may be formed on the cell insulating film 130. Also, a pre-bit line contact 146p may be formed between the cell conduction film structure 140p_ST and the substrate 100. The pre-bit line contact 146p may connect the cell conduction film structure 140p_ST and the substrate 100.

The cell conduction film structure 140p_ST may include a pre-cell conduction film 140p and a lower cell capping film 144p that are sequentially stacked on the cell insulating film 130. A first cell boundary spacer 246_1 and a second cell boundary spacer 246_2 may be formed on the side wall of the cell conduction film structure 140p_ST.

A peri gate structure 240ST may be formed on the substrate 100 of the peri region 24. The peri gate structure 240ST may include a peri gate insulating film 230, a peri gate conduction film 240, a peri capping film 244, and a peri spacer 245.

Further, a first block conduction structure 240ST_1 and a second block conduction structure 240ST_2 may be formed on the substrate 100.

The cell conduction film structure 140p_ST may be formed simultaneously with the peri gate structure 240ST.

More specifically, the cell conduction film structure 140p_ST may be formed simultaneously with the peri gate insulating film 230, the peri gate conduction film 240, and the peri capping film 244. The first cell boundary spacer 246_1 and the second cell boundary spacer 246_2 may be formed simultaneously with the peri spacer 245.

Subsequently, the second etching stop film 250 may be formed on the substrate 100. The second etching stop film 250 may be formed on the cell conduction film structure 140p_ST, the peri gate structure 240ST, the first block conduction structure 240ST_1, and the second block conduction structure 240ST_2. The second etching stop film 250 may extend along the profile of the cell conduction film structure 140p_ST, the profile of the peri gate structure 240ST, the profile of the first block conduction structure 240ST_1, and the profile of the second block conduction structure 240ST_2.

Subsequently, the first pre-interlayer insulating film 290p may be formed on the second etching stop film 250. The first pre-interlayer insulating film 290p may entirely cover the second etching stop film 250. The first pre-interlayer insulating film 290p may include, for example, an oxide-based insulating material.

Referring to FIGS. 17A to 17E, by removing the first pre-interlayer insulating film 290p placed on the upper face of the cell conduction film structure 140p_ST and the upper face of the peri gate structure 240ST, a second pre-interlayer insulating film 290g may be formed on the second etching stop film 250.

For example, the second pre-interlayer insulating film 290g may be formed using a chemical mechanical polishing process (CMP). That is, the first pre-interlayer insulating film 290p on the upper face of the cell conduction film structure 140p_ST and the upper face of the peri gate structure 240ST can be removed, using the chemical mechanical polishing process (CMP).

Accordingly, the second etching stop film 250 on the upper face of the cell conduction film structure 140p_ST and the upper face of the peri gate structure 240ST may be exposed.

Figure 18A:
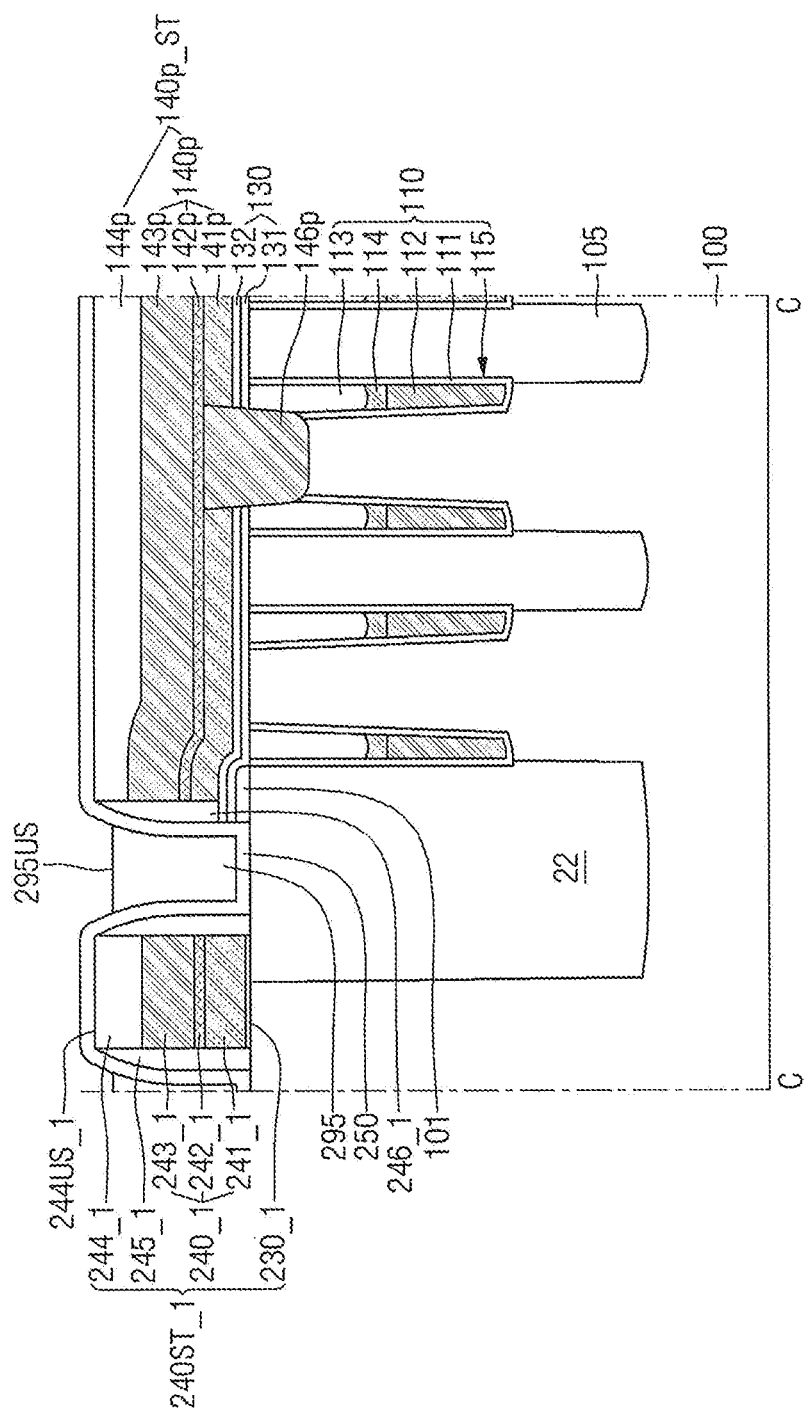
Figure 18B:
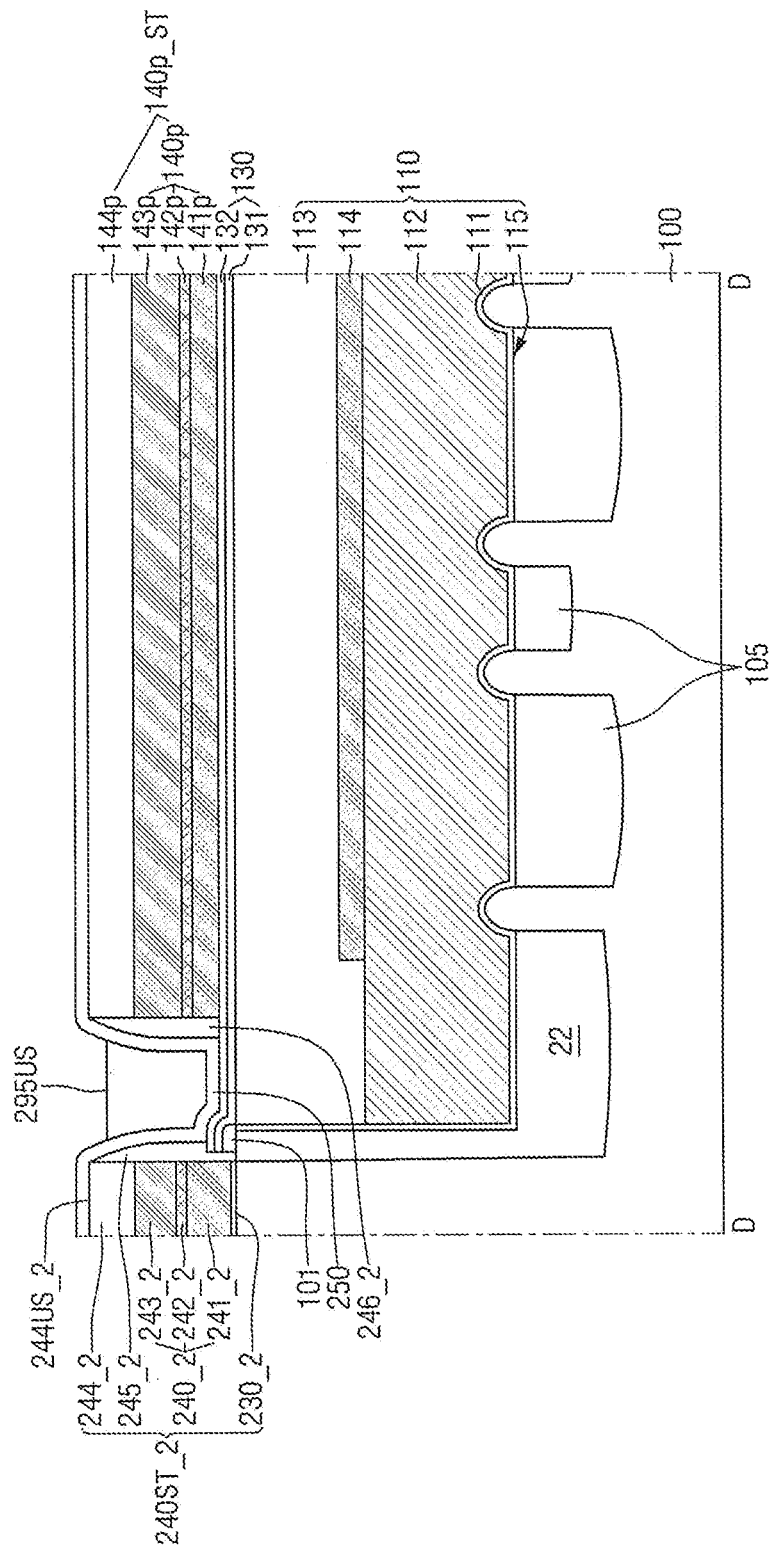
Figure 18C:
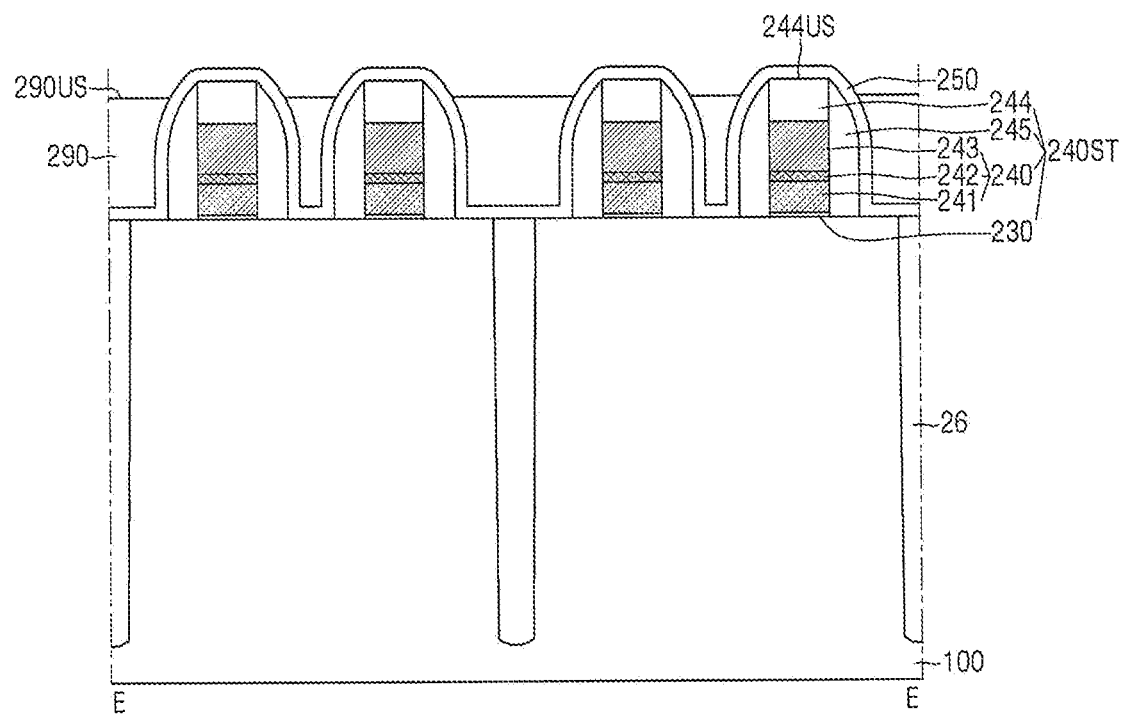
Figure 19A:
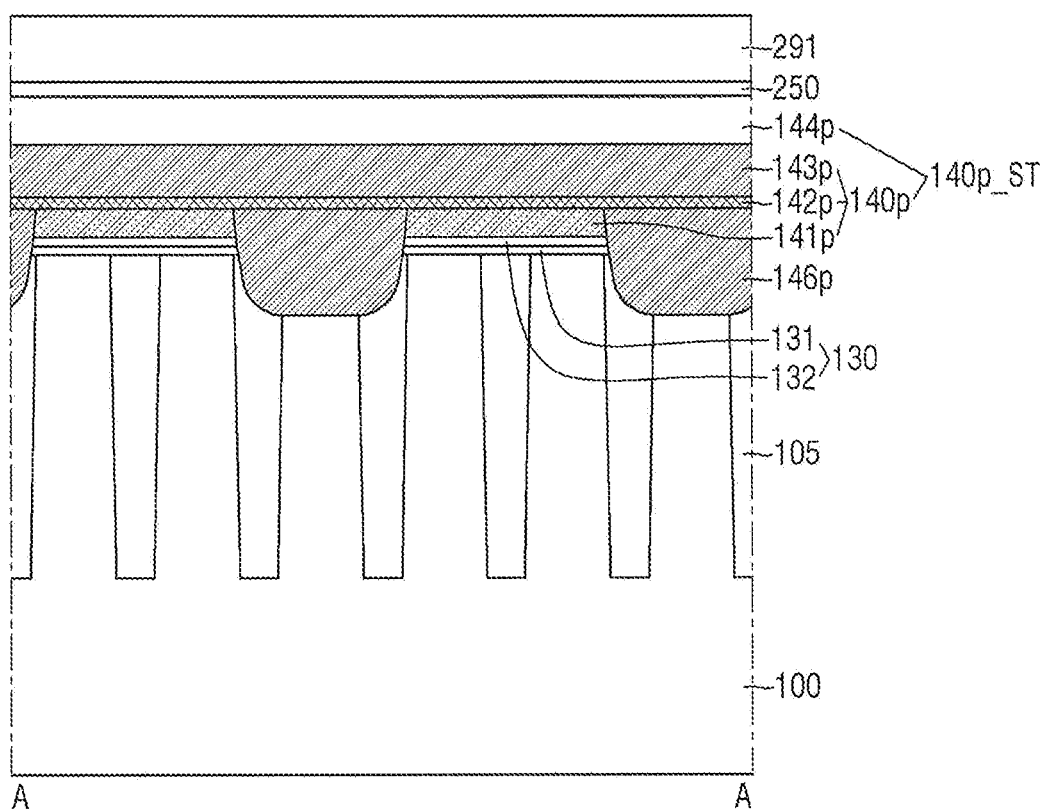
Figure 19B:
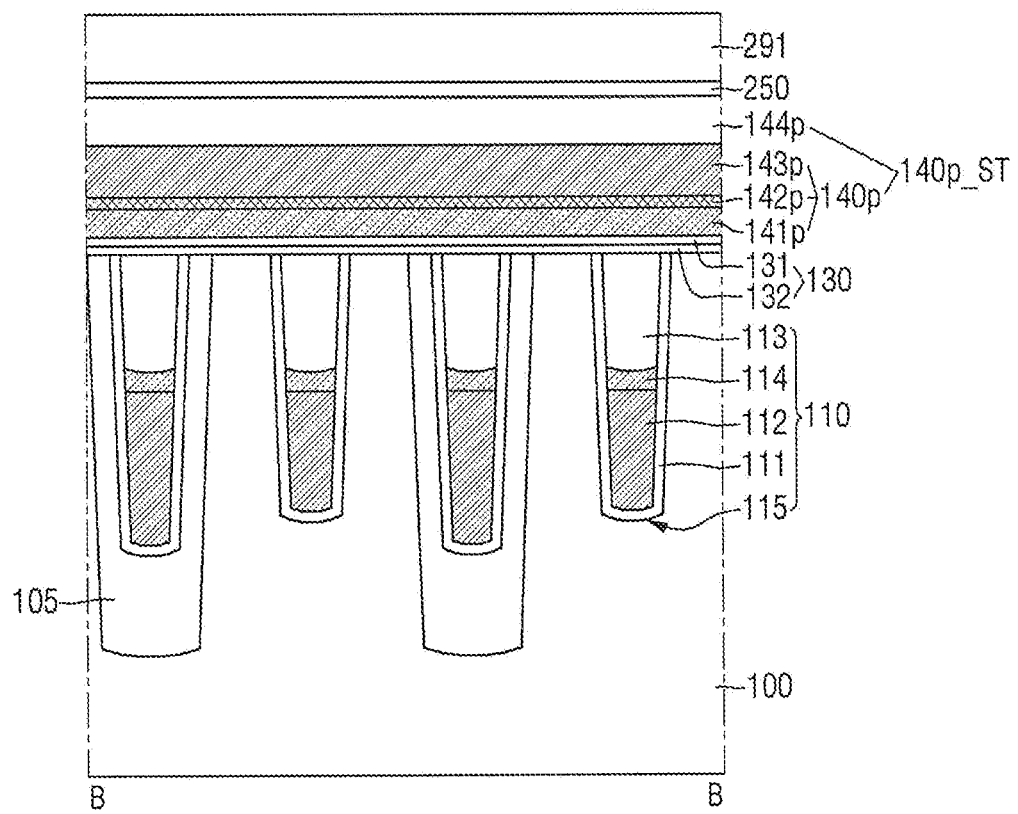
Figure 19C:
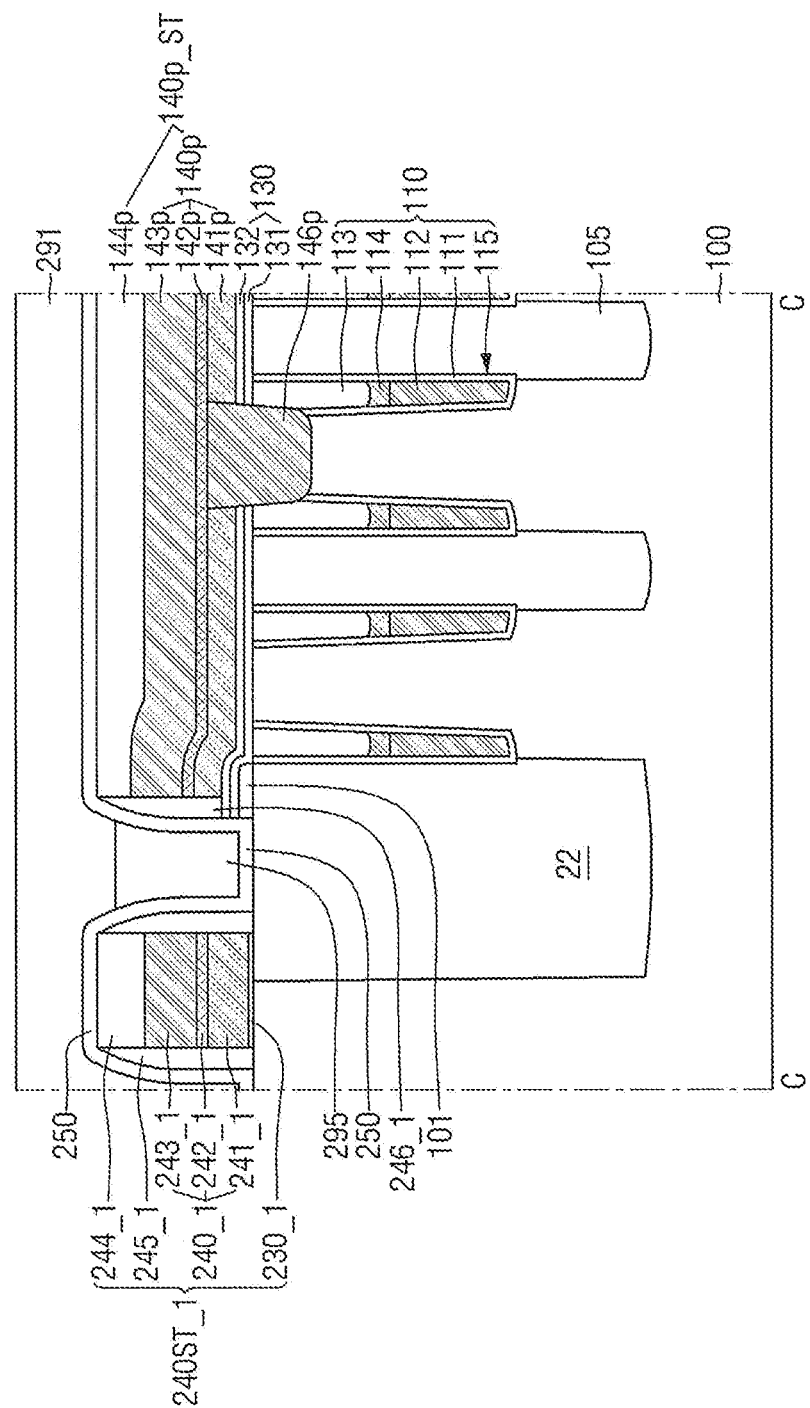
Figure 19D:
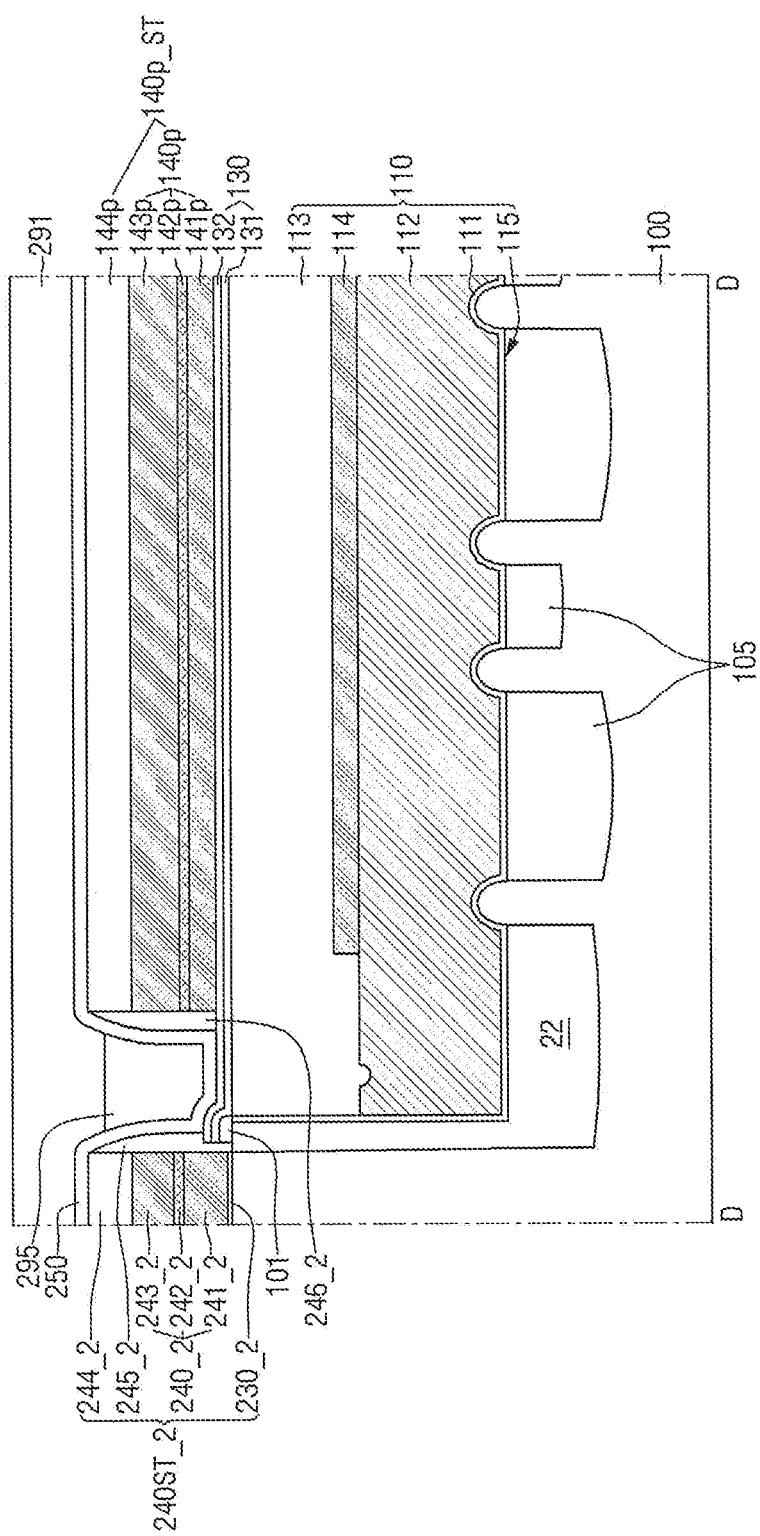
Figure 19E:
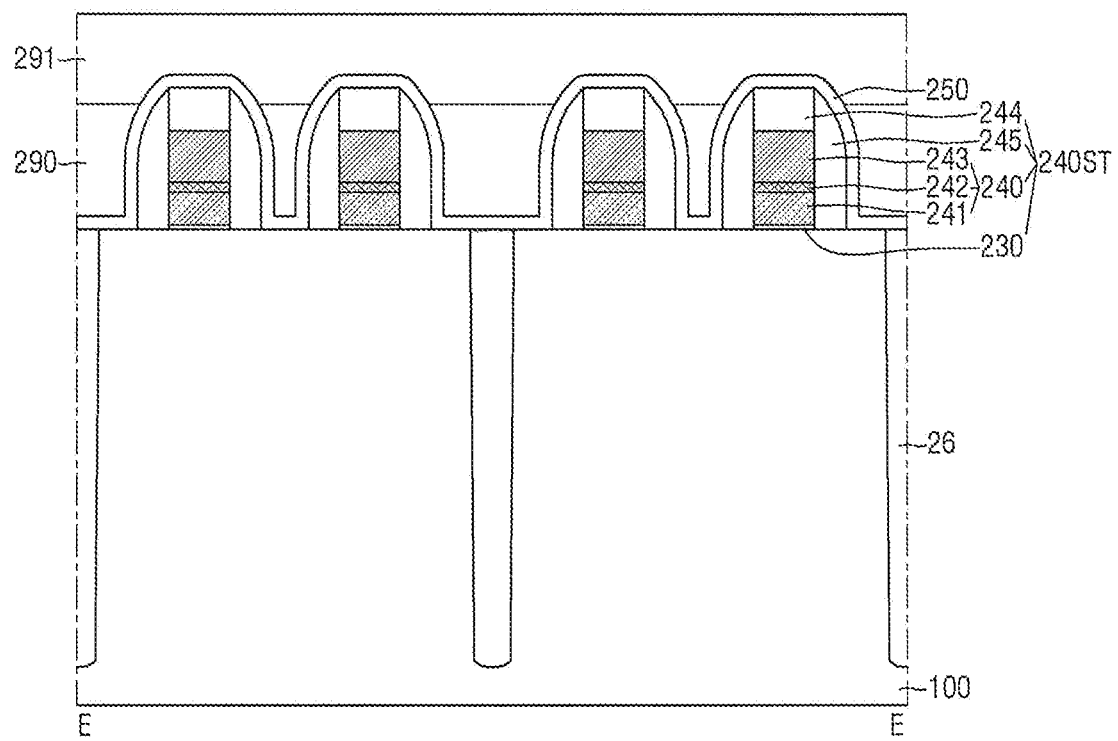

Referring to FIGS. 18A to 18C, a part of the second pre-interlayer insulating film 290g may be removed through an etch-back process. Accordingly, the first peri interlayer insulating film 290 and the cell interlayer insulating film 295 may be formed on the second etching stop film 250.

A height of the upper face 290US of the first peri interlayer insulating film 290 may be smaller than a height of the upper face 244US of the peri capping film 244, on the basis of the upper face of the substrate 100. Further, the upper face 295US of the cell interlayer insulating film 295 may be lower than the height of the upper face 244US_1 of the first block capping film 244_1 and the height of the upper face 244US_2 of the second block capping film 244_2, on the basis of the upper face of the substrate 100.

Unlike the shown case, a part of the cell interlayer insulating film 295 between the first block conduction structure 240ST_1 and the cell conduction film structure 140p_ST may be further removed through an additional masking process Referring to FIGS. 19A to 19E, an insertion interlayer insulating film 291 may be formed on the first peri interlayer insulating film 290 and the cell interlayer insulating film 295.

The insertion interlayer insulating film 291 may be formed on the second etching stop film 250 protruding upward from the first peri interlayer insulating film 290 and the cell interlayer insulating film 295. The insertion interlayer insulating film 291 may also be formed on the cell region 20 as well as on the peri region 24.

Referring to FIGS. 20A to 20E, the cell conduction structure 140p_ST, the insertion interlayer insulating film 291, and the second etching stop film 250 on the cell region 20 may be patterned to form a bit line structure 140ST having a longitudinal axis extending in the second direction D2.

The cell line capping film 144 may include a patterned lower cell capping film (144p of FIG. 16A), a patterned second etching stop film (250 of FIG. 16A), and a patterned insertion interlayer insulating film 291.

A bit line contact 146 may be formed, while the bit line structure 140ST is being formed.

Subsequently, a cell line spacer 150 may be formed. A fourth cell line spacer 154 in the cell line spacer 150 may also be formed on the upper face of the bit line structure 140ST and on the insertion interlayer insulating film 291 of the peri region 24.

Subsequently, a fence sacrificial insulating film 170_SC may be formed between the bit line structures 140ST adjacent in the first direction D1. The fence sacrificial insulating film 170_SC may be formed on the fourth cell line spacer 154.

Figure 21A:
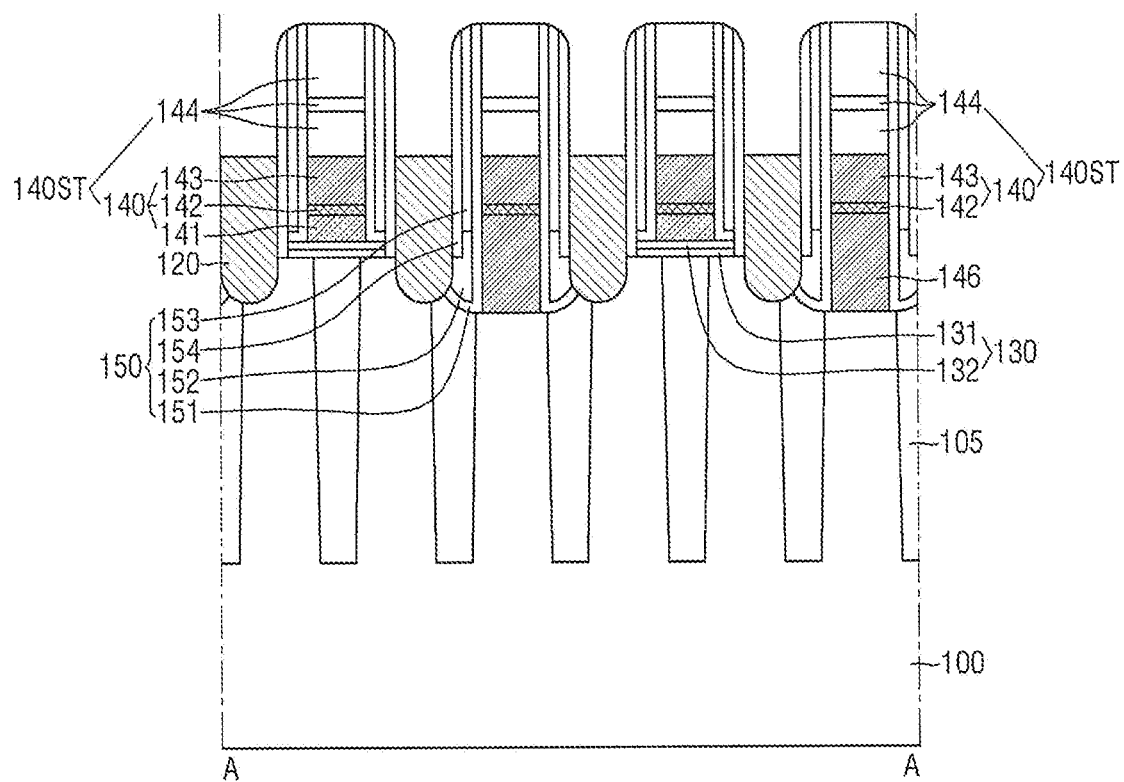
Figure 21B:
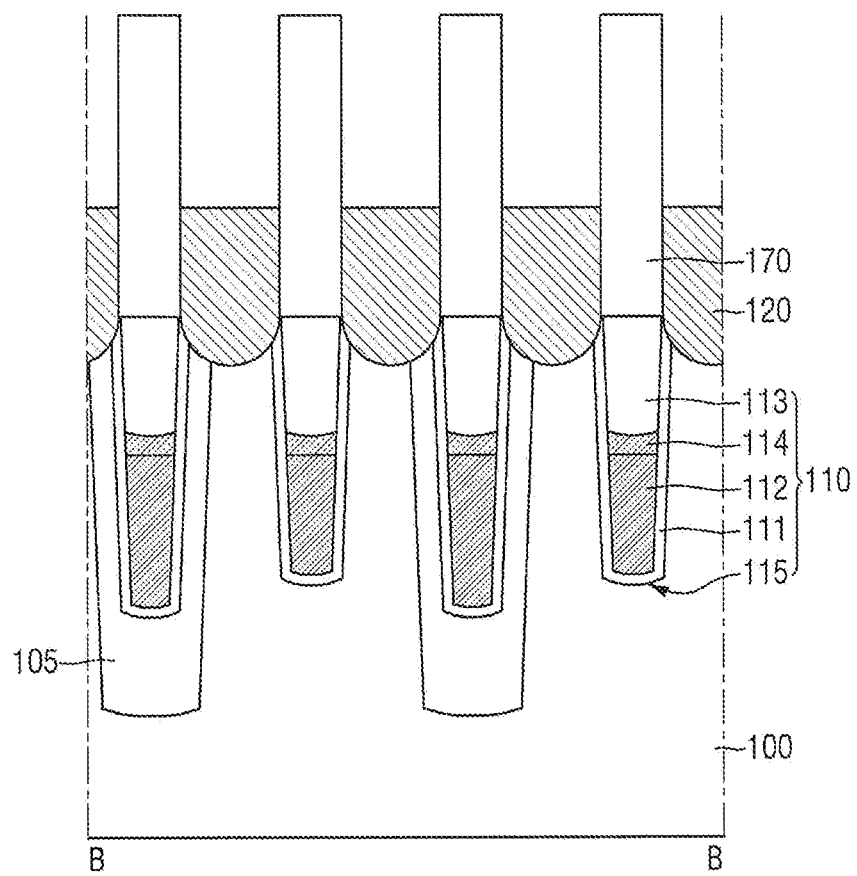

Referring to FIGS. 21A and 21B, the fence sacrificial insulating film 170_SC may be patterned to form a fence pattern 170 on the cell gate structure 110.

After forming the fence pattern 170, a storage contact 120 may be formed between the adjacent cell conduction lines 140, and between the fence patterns 170 adjacent in the second direction D2.

Referring to FIGS. 4 to 8, after the storage contact 120 is formed, the storage pad 160, the peri contact plug 260, the peri wiring line 265, the bit line contact plug 261, and the cell gate contact plug 262 may be formed.

Subsequently, the first etching stop film 292 may be formed. Also, an information storage part 190 may be formed.

Those skilled in the art will appreciate that many variations and modifications may be made to the embodiments described herein without substantially departing from the principles of the present disclosure. Therefore, the disclosed embodiments of the present disclosure are used in a generic and descriptive sense only and not for purposes of limitation.

What is claimed is:

1. A semiconductor memory device comprising:
   a substrate comprising a cell region and a peripheral region around the cell region;
   a cell region isolation film in the substrate, the cell region isolation film defining the cell region, wherein the cell region isolation film is interposed between the cell region and the peripheral region;
   a bit line structure on the cell region;
   a first peripheral gate structure on the peripheral region of the substrate, the first peripheral gate structure comprising a first peripheral gate conduction film and a first peripheral capping film on the first peripheral gate conduction film;
   a peripheral interlayer insulating film around the first peripheral gate structure and on the substrate, the peripheral interlayer insulating film being non-overlapping with the cell region in plan view;
   an insertion interlayer insulating film on the peripheral interlayer insulating film and the first peripheral gate structure, the insertion interlayer insulating film comprising a material that is different from the peripheral interlayer insulating film;
   a block conduction structure comprising a block capping film on the a block conduction line; and
   a cell interlayer insulating film on the cell region isolation film between the block conduction structure and the bit line structure,
   wherein an upper face of the cell interlayer insulating film is closer to the substrate than an upper face of the block capping film,
   wherein an upper face of the peripheral interlayer insulating film is closer to the substrate than an upper face of the first peripheral capping film,
   wherein the first peripheral gate structure further comprises a peripheral spacer on side walls of the first peripheral gate conduction film and the first peripheral capping film, and
   wherein a height, with respect to an upper face of the substrate, of the upper face of an uppermost portion of the peripheral interlayer insulating film is less than a height, with respect to the upper face of the substrate, of an uppermost portion of the peripheral spacer.

2. The semiconductor memory device of claim 1, wherein the bit line structure comprises a cell conduction line on the substrate and extending in a first direction and a cell line capping film on the cell conduction line, and
   wherein a thickness of the first peripheral gate conduction film is equal to a thickness of the cell conduction line.

3. The semiconductor memory device of claim 2, wherein a thickness of the cell line capping film is greater than a thickness of the first peripheral capping film.

4. The semiconductor memory device of claim 2, wherein the
   block conduction line is spaced apart from the cell conduction line in the first direction,
   wherein the cell interlayer insulating film on the cell region isolation film is between the block conduction line and the cell conduction line, the cell interlayer insulating film comprising a same material as the peripheral interlayer insulating film.

5. The semiconductor memory device of claim 1, wherein a height, with respect to the upper face of the substrate, of the upper face of the peripheral interlayer insulating film is greater than a height, with respect to the upper face of the substrate, of the upper face of the cell interlayer insulating film.

6. The semiconductor memory device of claim 1, further comprising:
   a second peripheral gate structure on the peripheral region of the substrate, the second peripheral gate structure comprising a second peripheral gate conduction film and a second peripheral capping film on the second peripheral gate conduction film; and
   a third peripheral gate structure on the peripheral region of the substrate, the third peripheral gate structure comprising a third peripheral gate conduction film and a third peripheral capping film on the third peripheral gate conduction film,
   wherein the first peripheral gate structure is between the second peripheral gate structure and the third peripheral gate structure, and
   wherein the upper face of the peripheral interlayer insulating film is closer to the substrate than an upper face of the second peripheral capping film and an upper face of the third peripheral capping film.

7. The semiconductor memory device of claim 6, wherein a distance between the first peripheral gate conduction film and the second peripheral gate conduction film is greater than a distance between the first peripheral gate conduction film and the third peripheral gate conduction film, and wherein a height, with respect to an upper face of the substrate, of the upper face of the peripheral interlayer insulating film between the first peripheral gate conduction film and the second peripheral gate conduction film is equal to a height, with respect to the upper face of the substrate, of the upper face of the peripheral interlayer insulating film between the first peripheral gate conduction film and the third peripheral gate conduction film.

8. The semiconductor memory device of claim 6, wherein a distance between the first peripheral gate conduction film and the second peripheral gate conduction film is greater than a distance between the first peripheral gate conduction film and the third peripheral gate conduction film, and wherein a height, with respect to an upper face of the substrate, of the upper face of the peripheral interlayer insulating film between the first peripheral gate conduction film and the second peripheral gate conduction film is smaller than a height, with respect to the upper face of the substrate, of the upper face of the peripheral interlayer insulating film between the first peripheral gate conduction film and the third peripheral gate conduction film.

9. The semiconductor memory device of claim 1, further comprising:
a contact plug on either of opposing sides of the first peripheral gate structure, the contact plug penetrating the insertion interlayer insulating film and the peripheral interlayer insulating film.

10. The semiconductor memory device of claim 1, wherein the peripheral interlayer insulating film comprises an oxide-based insulating material, and
wherein the first peripheral capping film and the insertion interlayer insulating film each comprise silicon nitride.

11. A semiconductor memory device comprising:
a substrate comprising a cell region and a peripheral region around the cell region;
a bit line structure on the cell region;
a first peripheral gate structure, a second peripheral gate structure, and a third peripheral gate structure on the peripheral region of the substrate and spaced apart from each other; and
a peripheral interlayer insulating film placed around the first to third peripheral gate structures on the substrate,
wherein each of the first to third peripheral gate structures comprises a peripheral gate conduction film, a peripheral capping film on the peripheral gate conduction film, and a peripheral spacer on side walls of the peripheral gate conduction film and the peripheral capping film,
wherein the first peripheral gate structure is between the second peripheral gate structure and the third peripheral gate structure, wherein an upper face of the peripheral interlayer insulating film is closer to the substrate than an upper face of the peripheral capping film of each of the first to third peripheral gate structures,
wherein a first distance between the peripheral gate conduction film of the first peripheral gate structure and the peripheral gate conduction film of the second peripheral gate structure is different from a second distance between the peripheral gate conduction film of the first peripheral gate structure and the peripheral gate conduction film of the third peripheral gate structure, and
wherein a height, with respect to an upper face of the substrate, of the upper face of the peripheral interlayer insulating film between the first peripheral gate structure and the second peripheral gate structure is different from a height, with respect to the upper face of the substrate, of the upper face of the peripheral interlayer insulating film between the first peripheral gate structure and the third peripheral gate structure.

12. The semiconductor memory device of claim 11, wherein the first distance is greater than the second distance, and
wherein the height, with respect to the upper face of the substrate, of the upper face of the peripheral interlayer insulating film between the first peripheral gate structure and the second peripheral gate structure is smaller than the height, with respect to the upper face of the substrate, of the upper face of the peripheral interlayer insulating film between the first peripheral gate structure and the third peripheral gate structure.

13. The semiconductor memory device of claim 11, wherein the bit line structure comprises:
a cell conduction line on the substrate and electrically connected to the substrate; and
a cell line capping film on the cell conduction line, and
wherein a thickness of the peripheral gate conduction film of each of the first to third peripheral gate structures is equal to a thickness of the cell conduction line.

14. The semiconductor memory device of claim 13, further comprising a cell interlayer insulating film around the bit line structure,
wherein a height, with respect to the upper face of the substrate, of an upper face of the cell interlayer insulating film is smaller than the height, with respect to the upper face of the substrate, of the upper face of the peripheral interlayer insulating film.

15. The semiconductor memory device of claim 11, wherein the height, with respect to the upper face of the substrate, of the upper face of the peripheral interlayer insulating film is smaller than a height, with respect to the upper face of the substrate, of an uppermost portion of the peripheral spacer of the first to third peripheral gate structures.

* * * * *